United States Patent [19]

Miyawaki et al.

[11] Patent Number: 5,633,182

[45] Date of Patent: May 27, 1997

[54] METHOD OF MANUFACTURING AN IMAGE DISPLAY DEVICE WITH REDUCED CELL GAP VARIATION

[75] Inventors: Mamoru Miyawaki, Isehara; Shigeki Kondo, Hiratsuka; Yoshio Nakamura, Atsugi; Tetsunobu Kouchi, Hiratsuka, all of Japan

[73] Assignee: Canon Kabushiki Kaisha, Tokyo, Japan

[21] Appl. No.: 570,809

[22] Filed: Dec. 12, 1995

Related U.S. Application Data

[60] Continuation of Ser. No. 235,787, Apr. 29, 1994, which is a division of Ser. No. 984,099, Dec. 1, 1992, Pat. No. 5,317,433.

[30] Foreign Application Priority Data

Dec. 2, 1991 [JP] Japan .................................. 3-341761
Nov. 13, 1992 [JP] Japan .................................. 4-327570

[51] Int. Cl.⁶ .................................................. H01L 21/84
[52] U.S. Cl. ............................ 438/30; 438/164; 438/409; 438/960
[58] Field of Search ................... 437/40, 50–51, 437/71, 86, 181, 974, 41; 148/DIG. 135

[56] References Cited

U.S. PATENT DOCUMENTS

| 4,432,610 | 2/1984 | Kobayashi et al. | 359/59 |
| 4,836,650 | 6/1989 | Morin et al. | 350/334 |
| 4,871,234 | 10/1989 | Suzuki | 350/333 |
| 5,121,236 | 6/1992 | Ukai et al. | 359/59 |
| 5,179,042 | 1/1993 | Mikoshiba et al. | |
| 5,233,211 | 8/1993 | Hayashi et al. | 359/59 |
| 5,258,322 | 11/1993 | Sakaguchi et al. | |
| 5,282,068 | 1/1994 | Inaba | 359/54 |
| 5,374,570 | 12/1994 | Nasu et al. | 437/40 |
| 5,374,581 | 12/1994 | Ichikawa et al. | 437/62 |

FOREIGN PATENT DOCUMENTS

| 0425084 | 5/1991 | European Pat. Off. |
| 3015936 | 10/1981 | Germany |
| 3315671 | 11/1983 | Germany |
| 3720469 | 12/1988 | Germany |
| 60-236267A | 11/1985 | Japan |
| 2154232 | 6/1990 | Japan |
| 04056282 | 2/1992 | Japan |
| 2122419 | 1/1984 | United Kingdom |

OTHER PUBLICATIONS

Holstom et al., "Complete Dielectric Isolation by Highly Selective and Self–Stopping Formation of Oxidited Porous Silicon", Applied Physics Letters, vol. 42, No. 4, Feb. 1983, pp. 386–388.

Unagami, "Formation Mechanism of Porous Silicon Layer by Anodization in HF Solution," Journal of Electrochemical Society, vol. 127 No. 2 Feb. 1980, pp. 476–483.

Primary Examiner—John Niebling
Assistant Examiner—Richard A. Booth
Attorney, Agent, or Firm—Fitzpatrick, Cella, Harper & Scinto

[57] ABSTRACT

Variations in the individual liquid crystal cells and cross-talk between adjacent pixels are reduced, stable operation is maintained and the aperture and the S/N ratio are increased by providing a transistor and an interconnection layer therefor on one surface of an insulating layer while providing an electrode for applying a voltage to a liquid crystal on the other surface thereof. One major electrode portion of the transistor and the liquid crystal voltage applying electrode are connected to each other using an electrode via an opening. Also, the electrode for connecting the major electrode portion 3 to the liquid crystal voltage applying electrode is provided on the other surface of the insulating layer such that it shield the transistor from light.

12 Claims, 18 Drawing Sheets

METHOD OF MANUFACTURING AN IMAGE DISPLAY DEVICE WITH REDUCED CELL GAP VARIATION

This application is a continuation of application Ser. No. 08/235,787 filed Apr. 29, 1994, now abandoned, which in turn is a division of application Ser. No. 07/984,099, filed Dec. 1, 1992, now U.S. Pat. No. 5,317,433.

BACKGROUND OF THE INVENTION

1. Field of the Invention

The present invention relates to a liquid crystal image display device and a method of manufacturing the same. More particularly, the present invention relates to an image display device which provides an improved image display and a method of manufacturing the same.

2. Description of the Related Art

In recent years, liquid crystal image display devices have been attracting attention as providing thin and lightweight devices intended to replace cathode ray tube image displays. A cross-sectional view of a cell portion of a conventional liquid crystal image display device is shown in FIG. 3 in which reference numeral 100 denotes a driving transistor portion for driving a liquid crystal; 101 denotes a glass substrate; 102, 103 and 104 respectively denote a source portion, a drain portion and a gate portion of the driving transistor portion 100, a signal voltage to be applied to a liquid crystal layer being sent to a transparent electrode 106 from an interconnection 105 through the driving transistor portion 100; 107 and 109 denote an insulating layer; 108 denotes a liquid crystal layer in which a liquid crystal is driven by a voltage applied between a transparent electrode 110 and the transparent electrode 106; and 111 denotes a glass substrate on which a light blocking layer 112 is formed to prevent light from striking the driving transistor portion 100.

The typical liquid crystal cell in FIG. 1 has drawbacks in that (1) there are variations in the liquid crystal cells as well as an unstable alignment of the liquid crystal, and (2) there is light leakage from the adjacent individual pixels which can cause cross-talk. These drawbacks are explained in more detail below.

(1) Variations in the liquid crystal cells and unstable alignment of the liquid crystal As can be seen from FIG. 1, the liquid crystal layer 108 is provided on the driving transistor portion 100 and the interconnection layer 105. Both of the driving transistor portion 100 and the interconnection layer 105 define "shoulders" where the thickness of the liquid crystal layer 108 between the transparent electrodes 106 and 110 serving as the display electrodes varies in the cell, as indicated by intervals 113, 114 and 115 in FIG. 1. This makes impossible applying a uniform electric field to the liquid crystal layer 108. In a color display device, for example, the alignment of the liquid crystal changes slightly and thus generates an undesirable change in the color. Furthermore, due to problems related to the production process, there are variations in the shoulders of individual cells such that the display characteristics of the individual pixels differ, generating a fixed pattern noise.

These shoulders cause problems even in a display device with pixel dimensions as small as 60×89 μm. To overcome this deficiency, the effective portion may be provided by a flat area alone. However, this reduces the aperture ratio and thus darkens the display screen. Furthermore, in a desirable display device in which the number of pixels has been increased from several ten thousands used currently to a range of from several hundred thousands to one million, the pixel size is further reduced to a range of from 20×30 μm² to several tens μm², practically eliminating the flat area. The shoulders may be reduced also by increasing the thickness of the insulating layers 107 and 109. However, this weakens the electric field effectively applied to the liquid crystal layer, and thus necessitates a corresponding increase in the driving voltage. Since the liquid crystal driving voltage is some 5 v higher than that applied to a normal semiconductor device, any further increase is disadvantageous in terms of the maximum voltage that the driving transistor can withstand. Thus, the reduction in the deleterious effect of the shoulders cannot easily be attained in practice.

Since the thickness of the liquid crystal layer 108 is particularly small in a ferroelectric liquid crystal display device, even a slight change in the thickness of the ferroelectric liquid crystal layer may greatly affect the display characteristics, making high-definition display difficult.

Furthermore, in a display device in which the electrical capacitance of the liquid crystal (the "liquid crystal capacitance") is not sufficiently large or in which the effective resistance parallel-connected to the liquid crystal capacitance is low, a storage capacitance must be parallel-connected to the liquid crystal capacitance. However, the deflected voltage may also be reduced by increasing the storage capacitance parallel-connected to the liquid crystal capacitance, reducing the aperture ratio and degrading the reliability of the insulating film which forms the storage capacitance.

In the aforementioned conventional structure shown in FIG. 1, since the interconnection layer connected to the source 103 and gate 104 of the thin-film transistor is present on the same surface as that of the display electrode 16, the capacitive coupling between the interconnection and the display electrode is large, thus causing deflection of the display electrode potential due to cross-talk and deteriorating the display quality of the liquid crystal display device. To reduce cross-talk, the distance between the interconnection layer and the display electrode may be increased. However, this reduces the aperture ratio. Reduction in cross-talk may also be achieved by increasing the thickness of the interlayer film provided between the interconnection layer and the display electrode. However, this increases the magnitude of the shoulders.

Additionally, the liquid crystal molecules are normally aligned to the substrate layer by rubbing. Rubbing is performed by mechanically rubbing the surface of the substrate. However, it is difficult to uniformly rub the entire area of the substrate having an interconnection providing a large number of shoulders. Thus, the liquid crystal molecules may not be aligned uniformly, causing a display failure or a difference in the characteristics.

(2) Light leakage from among the individual pixels

As shown in FIG. 1, the light-blocking layer 112 is formed separately from the driving transistor portion 100. Consequently, when a light enters the liquid crystal cell from above as viewed in FIG. 1, oblique or diffracted light may enter adjacent pixels, generating cross-talk. Furthermore, the light illuminated on the driving transistor portion 100 generates unnecessary carriers in the driving transistor portion 100, resulting an occasional malfunction. Therefore, in order to eliminate the problem involving light leakage, the size of the light-blocking layer is increased. This greatly reduces the effective aperture ratio, as in the case of the aforementioned problem (1).

Furthermore, where the light-blocking layer 112 is provided, it is necessary to provide both the light-blocking layer and an insulating layer, in addition to the interconnection layer. This further increases the magnitude of the shoulders.

SUMMARY OF THE INVENTION

In view of the aforementioned problems of the prior art, an object of the present invention is to provide an image display device with a reduced thickness and weight.

Another object of the present invention is to provide an image display device without or with substantially no variations in the display characteristics of the individual liquid crystal cells and which overcomes the unstable alignment of the liquid crystal.

Still another object of the present invention is to provide an image display device which reduces light leakage and cross-talk among the individual pixels to be reduced.

Still another object of the present invention is to provide an image display device which enables effectively blocking light to a driving transistor.

Still another object of the present invention is to provide an image display device which enables a substantially increased aperture ratio and which is capable of a bright display with a high SN ratio.

Still another object of the present invention is to provide an image display device which enables a more uniform liquid crystal layer thickness so as to achieve a finer device.

Still another object of the present invention is to provide an image display device which enables an increase in the driving voltage to be restricted so as to minimize generating problems involving the withstanding voltage of the driving transistor.

Still another object of the present invention is to provide a method of manufacturing an image display device which can achieve the aforementioned objects.

In one aspect of the present invention, there is provided an image display device which is characterized in that a transistor and an interconnection layer therefor are formed on one surface side of an insulating layer or base while a liquid crystal voltage applying electrode for applying a voltage to a liquid crystal is formed on the other surface side of the insulating layer or base, and also in that one of major electrode portions of said transistor and said liquid crystal voltage applying electrode are connected to each other through an opening portion in said insulating layer by an electrode formed on the other surface side of said insulating layer such that it shields the transistor from light.

In another aspect of the present invention, there is provided an image display device in which a pixel driving thin-film transistor and a driving interconnection for driving said thin-film transistor are provided on one surface of at least an insulating layer while a display electrode connected to a drain region of said pixel driving thin-film transistor is provided on the other surface of said insulating film, and in that a storage capacitance electrode is provided immediately above a connection area between the drain region of said pixel driving thin-film transistor and said display electrode.

In still another aspect of the present invention, there is provided a method of manufacturing an image display device, which comprises the steps of:

preparing a first substrate, said step of preparing said first substrate including the steps of: preparing a first base by forming a porous layer by anodization of single crystal silicon, forming an epitaxial layer of single crystal silicon on said porous layer, and forming a silicon oxide film; preparing a second base by forming a silicon film containing nitrogen on single crystal silicon and then forming a silicon oxide film on said nitrogen containing silicon film; stacking said silicon oxide films of said first and second bases on top of one another and then coupling said first and second bases to each other by heating; removing the porous layer (or both the porous layer and the single crystal silicon formed on an outer side thereof) of said first base; removing said epitaxial layer of the first base except for a necessary portion and then forming a transistor in the remaining epitaxial layer necessary portion; removing the single crystal silicon on said second base; forming a hole in said silicon film containing nitrogen and said silicon oxide films and then providing an electrical interconnection with said transistor at least in said hole; forming a transparent electrode layer electrically connected to said interconnection on said nitrogen-containing silicon film; and forming an insulating layer on said transparent electrode layer, preparing a second substrate having an electrode and orienting said second substrate such that said electrode is opposed to said transparent electrode, and providing a liquid crystal layer between said first and second substrates.

Other objects and advantages of the invention will become apparent during the following description taken in connection with the accompanying embodiments.

DETAILED DESCRIPTION OF THE PREFERRED EMBODIMENTS

Figure 1:
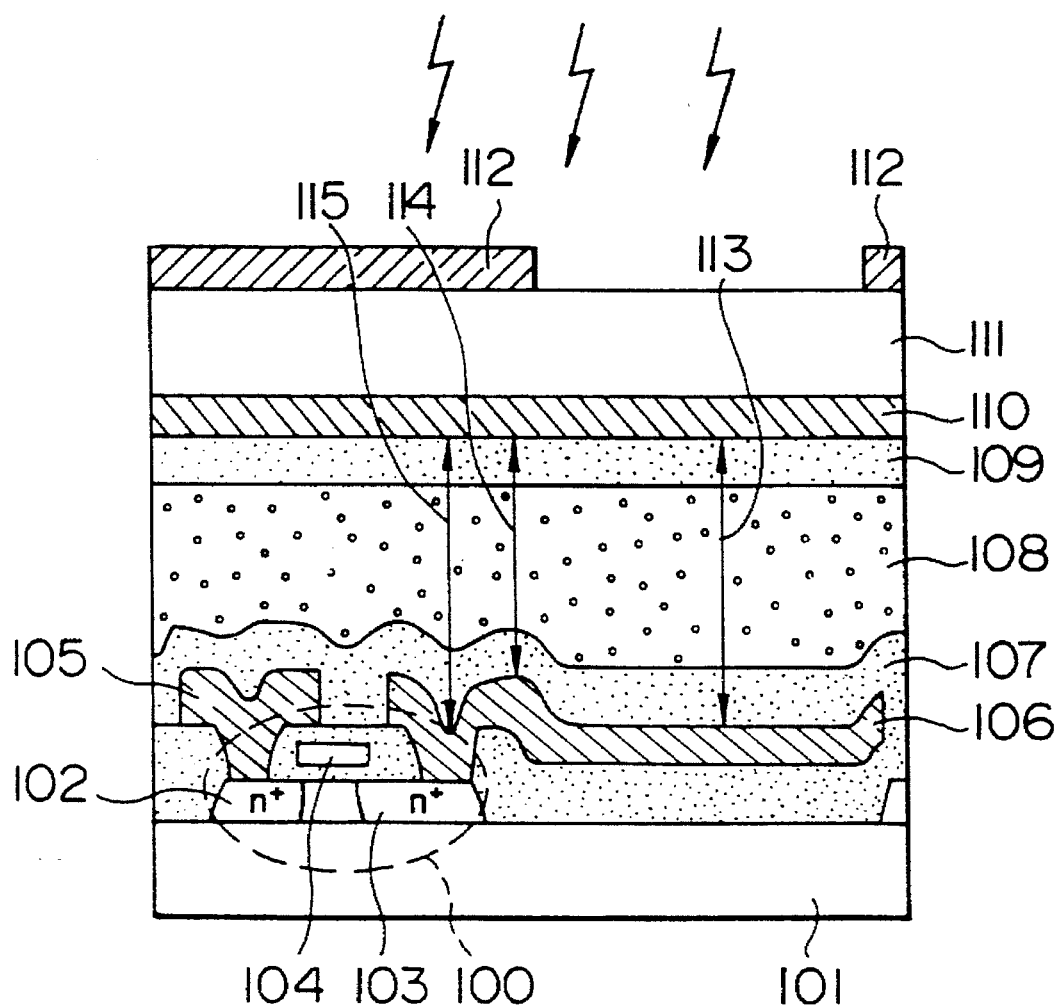
FIG. 1 is a schematic cross-sectional view of a cell portion of a conventional liquid crystal image display device.

Whereas a switching transistor, an interconnection layer and a liquid crystal voltage applying electrode are formed on the same surface of an insulating layer (or an insulator) in the conventional image display device of FIG. 1, in the image display device according to the present invention, the switching transistor and the interconnection layer are formed on one of the surfaces of the insulating layer (insulator) which is remote from the liquid crystal layer while the liquid crystal voltage applying electrode is formed on the other surface of the insulating layer close to the liquid crystal layer.

That is, the switching (driving) transistor and the interconnection layer are formed separately from the liquid crystal voltage applying electrode on the two surfaces of a (insulating) substrate. One of major electrode portions of the transistor and the liquid crystal voltage applying electrode are connected to each other via an opening portion of the insulating layer. In the aforementioned structure, since the switching transistor and interconnection layer which generate irregularities on the surface are not formed on the surface of the insulating layer which is close to the liquid crystal layer, even when the pixel size is reduced, the liquid crystal layer can be formed on a flat layer, reducing variations in the liquid crystal cells and making stable operation possible.

In the image display device according to the present invention, since the liquid crystal layer and the transistor are disposed on the different surfaces of the insulating layer, it is possible to provide a light-blocking layer near the transistor. Consequently, the aperture ratio can be increased, cross-talk among the adjacent pixels can be reduced, and the S/N ratio can be increased.

Additionally, in the image display device according to the present invention, since the electrode electrically connecting the major electrode portion of the transistor to the liquid crystal voltage applying electrode is embedded in an opening in the insulating layer, it cannot make the insulating layer surface close to the liquid crystal layer more irregular.

Furthermore, in the image display device according to the present invention, the electrode connecting the major electrode portion of the transistor to the liquid crystal voltage applying electrode is formed on the other source of the insulating layer. Therefore, the connecting electrode shields the transistor from light and so, providing another light-blocking layer is not necessary.

The present invention will be described below in detail with reference to the accompanying drawings.

Figure 2:
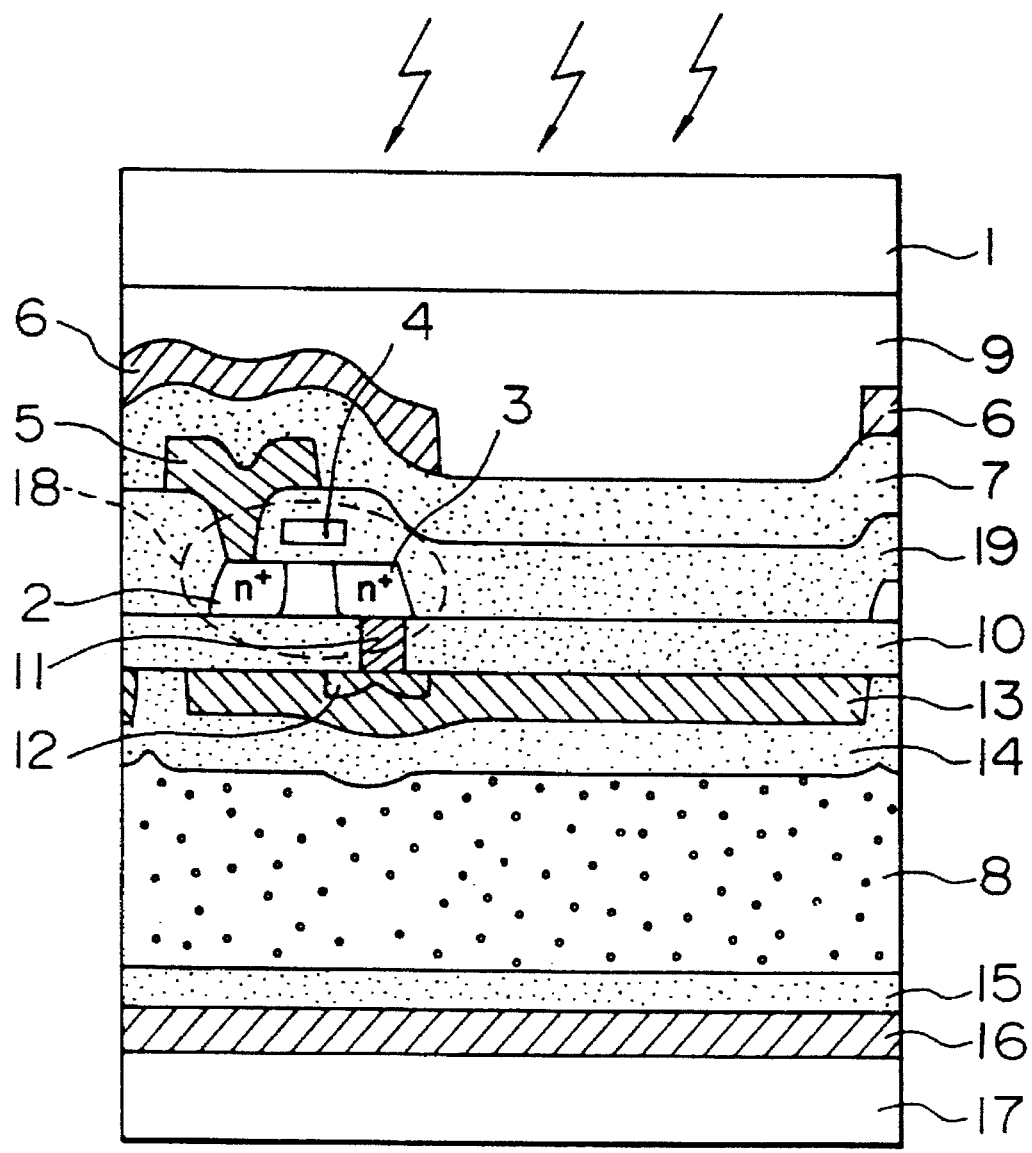
FIG. 2 is a schematic cross-sectional view of a liquid crystal image display device according to the present invention.

In FIG. 2, reference numeral 1 denotes a transparent substrate which serves as a protective member; 2, 3 and 4 respectively denote a source portion, a drain portion (both constituting major electrode portions) and a gate portion of a transistor portion 18 for driving a liquid crystal; 5 denotes an interconnection which is connected to the source portion 2 and from which a liquid crystal driving voltage is sent to a transparent electrode 13 via the driving transistor portion 18; 6 denotes a light-blocking layer; 7 denotes an interlayer insulator; 8 denotes a liquid crystal layer; 9, an adhesive layer for adhering the transparent substrate 1 to the driving transistor portion 18, the interconnection layer and so on; 10 denotes a flat insulating layer (an insulating substrate) provided below the driving transistor portion 18; 11 denotes a hole or opening through which the drain portion 3 of the driving transistor portion 18 is connected to the transparent electrode 13; 12 is an interconnection provided in the hole 11 to electrically connect the drain portion 3 to the transparent electrode 13; 13 and 16 are transparent electrodes (where transparent electrode 13 is a liquid crystal voltage applying electrode); 14, 15 and 19 are insulating layers; and 17 denotes a transparent substrate.

In the structure of the liquid crystal cell portion shown in FIG. 2:

(1) The driving transistor portion 18, the interconnection 5 and so on are provided on the flat insulating layer 10, and the liquid crystal layer 8 is provided on the side of the rear surface of the insulating layer 10. Since the transparent electrode 13 for applying an electric field to the liquid crystal layer 8 is provided on the surface of the flat insulating layer 10, the electric field between the transparent electrodes 13 and 16 can be made uniform. The liquid crystal cell portion having this structure is advantageous to a fine cell structure because the number or degree of shoulders does not increase even when the pixel size is reduced.

(2) Since the liquid crystal layer 8 is not present on the driving transistor portion 18, the light-blocking layer 6 is provided close to the upper portion of the driving transistor portion 18. Although the light-blocking layer 6 has shoulders due to the presence of the driving transistor portion 18 and so on, since the liquid crystal layer 8 is not disposed on the driving transistor portion 18, the magnitude of the shoulders does not affect the characteristics of the liquid crystal device. that is, providing the light-blocking layer 6 close to the driving transistor portion 18 improves cross-talk caused by light leakage among the adjacent pixels and thus increases the S/N ratio.

A manufacturing method of the aforementioned liquid crystal cell portion will be described below.

First, porous Si which is used in the manufacturing process of the liquid crystal cell portion will be explained for ease of the understanding of the method. Porous Si was discovered by Uhlir et al in the researching process of the electrolytic polishing of semiconductors in 1956. Unagami et al studied the dissolution reaction of Si in anodization, and reported that anodization of Si in a HF solution requires electron holes and is carried out in the following manner (T. Unagami, J. Electrochem. Soc., Vol. 127, No. 476 (1980):

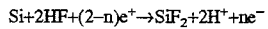

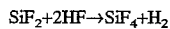

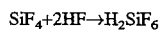

or

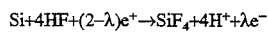

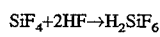

where $e^+$ and $e^-$ are respectively an electron hole and an electron, and n and $\lambda$ are respectively the number of electron holes required for a Si atom to dissolve, porous Si being formed under the condition of n>2 or $\lambda$>4.

As mentioned above, manufacture of porous Si requires electron holes, and P type Si is more easily changed into porous Si than is N type Si. However, it is known that N type Si also changes into porous Si by the injection of electron holes (R. P. Holmstrom and J. Y. Chi. Appl. Phys. Lett. Vol. 42, 386 (1983)).

Whereas the single crystal Si has a density of 2.33 g/cm$^3$, the density of porous Si can be changed to a range from 1.1 to 0.6 g/cm$^3$ by changing the concentration of the HF solution to 50 to 20%. It can be observed with a transmission type electronic microscope that the porous Si layer has pores having an average diameter of about 600 Å. As stated above, though the porous Si layer has a density which is half the density of single crystal Si, it has a single crystal structure and thus allows for a single crystal Si layer to be grown thereon by the epitaxial process. Also, since the porous Si layer has a large number of pores therein and thus has a density which is half the density of a non-porous layer, the surface area thereof is greatly increased relative to the volume thereof, thus greatly increasing the chemical etching rate thereof as compared with that of a non-porous Si layer.

Next, the method of forming a porous Si layer by anodization will be described.

Figure 3:
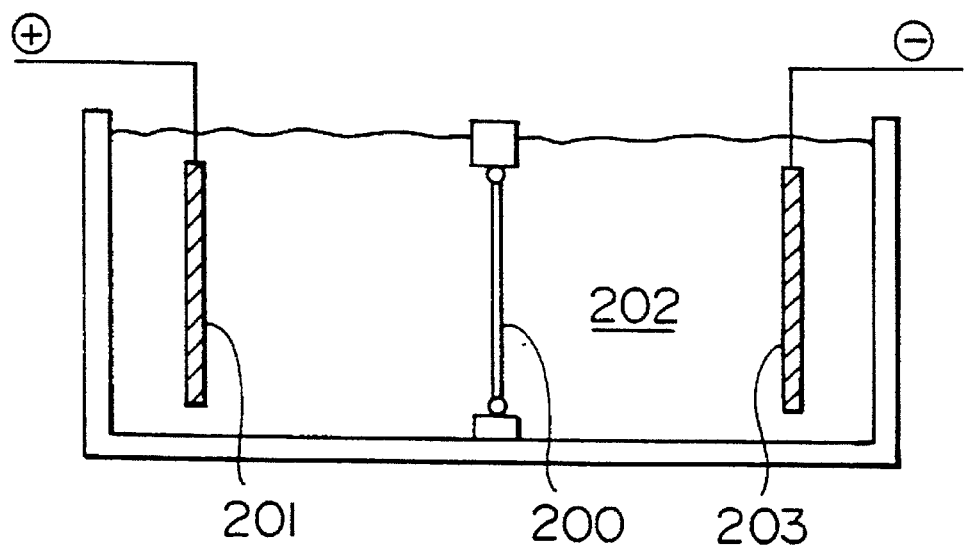
FIG. 3 schematically shows an anodization device.

First, a P type single crystal silicon substrate 200 is prepared. The substrate 200 is set in a device such as that shown in FIG. 3. That is, the substrate 200 is brought into contact with a hydrofluoric acid solution 202, and a negative electrode 203 is disposed on one side of the solution 202 while a positive electrode 201 is disposed on the other side thereof. The portion of the substrate 200 which is in contact with the hydrofluoric acid solution and which is located near the negative electrode is first made porous. Generally, concentrated (49%) hydrofluoric acid solution is used as the hydrofluoric acid solution 202. For the purpose of effectively removing bubbles generated from the surface of the substrate 202 during anodization, alcohol, such as methanol, ethanol, propanol or isopropanol, may be added as the surface-active agent. A stirring device may be used in place of the surface-active agent. Alternatively, both the surface-active agent and the stirring device may be used. The electrodes 201 and 203 are made of a material which cannot be corroded by the hydrofluoric acid solution, such as gold (Au) or platinum (Pt). The current value for anodization ranges from several hundreds A/cm$^2$ and the minimum is any non-zero value. It is set to a value which ensures that a good quality epitaxial layer can be grown on the surface of the silicon substrate which is made porous by this anodization in a subsequent process. Generally, as the current value increases, the anodization speed increases and the density of the porous silicon layer increases, i.e., the volume of the pores increases, thus changing the epitaxial growth conditions.

The method of manufacturing the liquid crystal cell portion will now be described below with reference to FIGS. 4 through 11.

Figure 4:
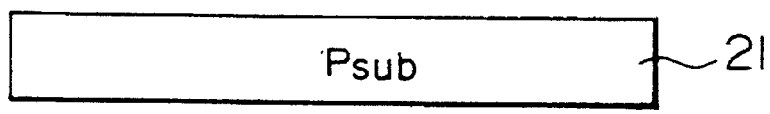
FIGS. 4 through 11 and 17(a), 17(b), 17(c), and 17(d) respectively show a method of manufacturing a liquid crystal cell portion shown in FIG. 2.
Figure 5:
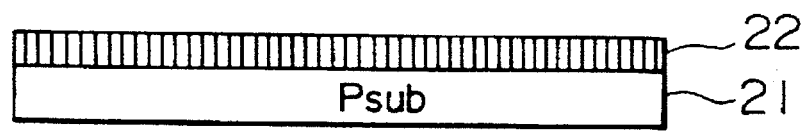

First, a P type single crystal Si substrate 21 is prepared, as shown in FIG. 4. Next, a 50 μm-thick porous layer 22 is formed on the surface of the P type Si substrate 21 by the aforementioned anodizing process, as shown in FIG. 5.

Figure 6:
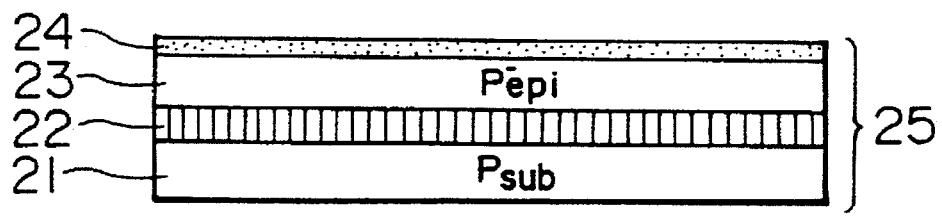
Figure 7:
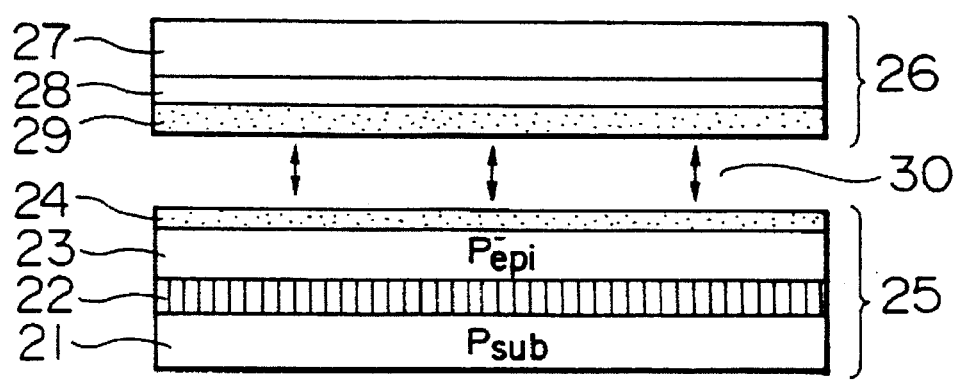

Thereafter, a single crystal low-concentration P type epitaxial layer 23 is formed to a thickness of 5000 Å on the porous layer 22, as shown in FIG. 6. Epitaxial growth is performed by the vacuum CVD process under the following conditions:

Drain gas: SiH$_4$

Carrier gas: H$_2$

Growth temperature: 850° C.

Pressure: 1×10$^{-2}$ Torr

Growth rate: 3.3 nm/sec

Thereafter, a 500 Å-thick oxide layer 24 is formed on the surface of the epitaxial layer 23, thus completing a wafer 25 which is to be laminated to another wafer.

Figure 27:
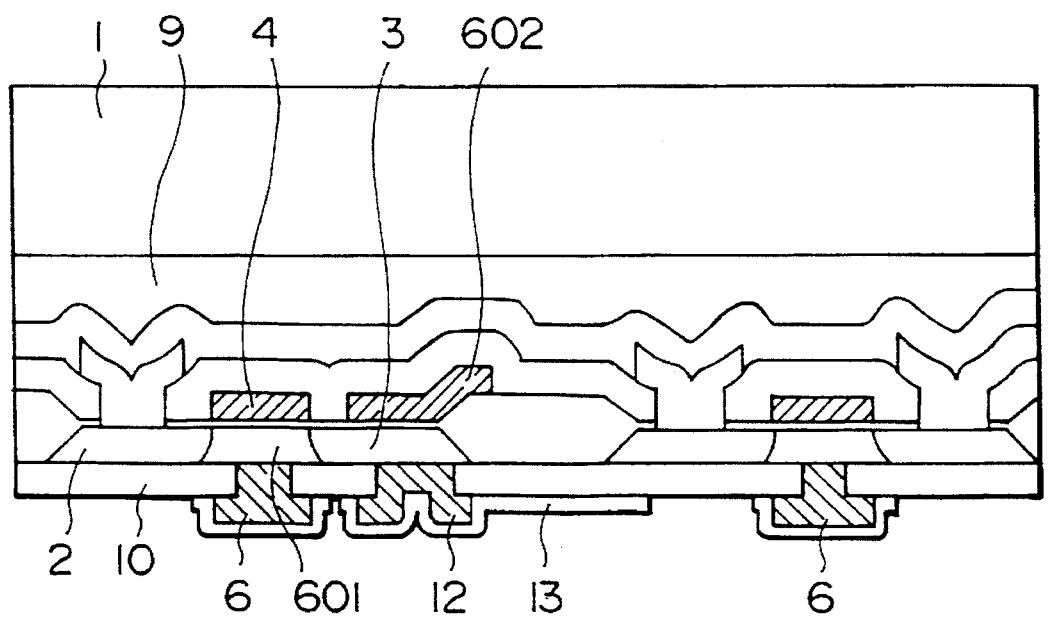

A wafer 26 which is to be pasted to the wafer 25 has a SiN film (a silicon film which contains nitrogen) 28 on a single crystal Si substrate 27, and a silicon oxide film 29 on the sin film 28, as shown in FIG. 27. Both of the films 28 and 29 have a thickness of about several μm. These two wafers 25 and 26 are laminated with surfaces indicated by 30 opposing each other under the following conditions:

First, both of the wafers 25 and 26 are washed first by a pure water and then by a mixture of sulfuric acid (H$_2$SO$_4$) and hydrogen peroxide, a mixture of hydrochloric acid and hydrogen peroxide, hydrofluoric acid, a mixture of hydrofluoric acid and hydrogen peroxide, an ammonia aqueous solution, a pure water or a combination of any of these solutions. Next, the oxide layers 24 and 29 are laid one on top of another. At that time, the oxide layers 24 and 29 are adhered to each other without conducing heat treatment and without applying external stress. This adhesion is accomplished by hydrogen bonding on the interface between the oxide layers 24 and 29. Next, heat treatment is conducted for laminating the wafers which are adhered to each other by hydrogen bonding. Heat treatment is conducted in an atmosphere of oxygen, nitrogen, hydrogen or a diluted gas, such as helium or argon, at a temperature of 600° C. or above. Generally, the higher the temperature of the heat treatment, the higher the bonding force on the interface, because the hydrogen bonded hydrogen and oxygen atoms are dehydrated in the form of H$_2$O at a temperature of about 200° C. or above, and condensated silanol bonds (Si—O—Si) remain. However, as long as dehydrated H$_2$O remains in the form of voids or the like near the interface, the bonding force is not at a maximum. The bonding force is maximized when the voids are diffused and thereby completely disappear. The bonding force is saturated at about 900° C. In this embodiment, annealing is conducted in an annealing furnace for 2 hours at 1000° C. in an atmosphere of nitrogen.

After laminating, if the P type Si substrate 21 remains, it is removed by polishing, for example, until the porous layer 22 is exposed. Thereafter, the porous layer 22 is removed by etching using an etchant which exhibits a high selection ratio for Si and porous Si.

Examples of suitable etchants used in this embodiment include hydrofluoric acid, buffered hydrofluoric acid and a mixture of hydrofluoric acid/buffered hydrofluoric acid, alcohol (such as ethylalcohol or isopropyl alcohol) and/or hydrogen peroxide.

Adding alcohol instantaneously removes bubbles of gas produced by etching from the etching surface without agitating them, thus encouraging uniform and effective etching of the porous Si. Adding hydrogen peroxide increases the oxidation speed of Si, thus increasing the reaction speed as compared with the case in which no hydrogen peroxide is added. A change in the proportion of hydrogen peroxide changes the reaction speed thereof. The concentration and temperature of the solution are set such that they allow hydrofluoric acid, buffered hydrofluoric acid, hydrogen peroxide or alcohol to have their effect and such that they assure an etching speed which can be practically obtained in the manufacturing process.

Figure 8:
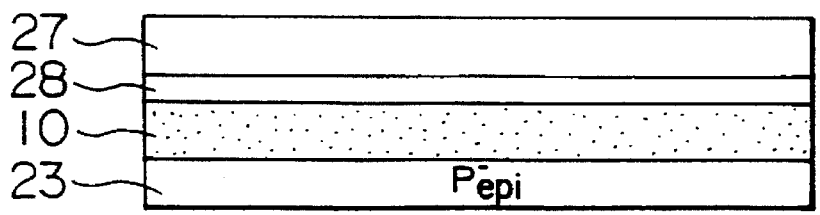

In this embodiment, the porous layer 22 is etched by immersing the pasted substrates in a mixture of 49% hydrofluoric acid, alcohol and 30% hydrogen peroxide (having a mixture ratio of 10:6:50) at an ambient temperature without stirring the mixture. The 50 μm-thick porous layer 22 is etched in about 1 minute, thus completing a SOI wafer in which the oxide film 10 and the P$^-$ epitaxial film 23 are provided on the Si substrate 27 with the SiN film 28 therebetween, as shown in FIG. 8.

Figure 9:
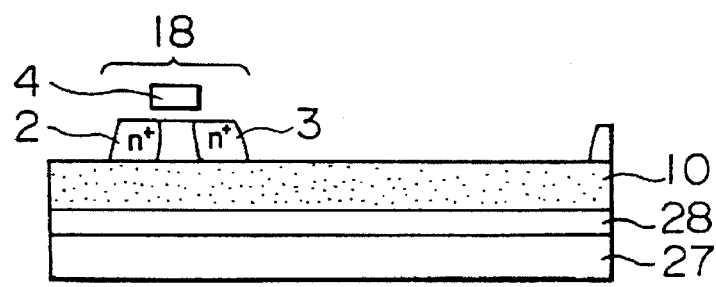

Next, as shown in FIG. 9, the P$^-$ epitaxial film 23 is removed by etching except for the driving transistor portion 18. After gate oxidation, the n$^+$ polysilicon gate portion 4 is formed. Subsequently, the source portion 2 and the drain portion 3 are formed by performing As or P ion injection and annealing by the normal self-alignment procedures using the gate portion 4 as a mask.

Figure 10:
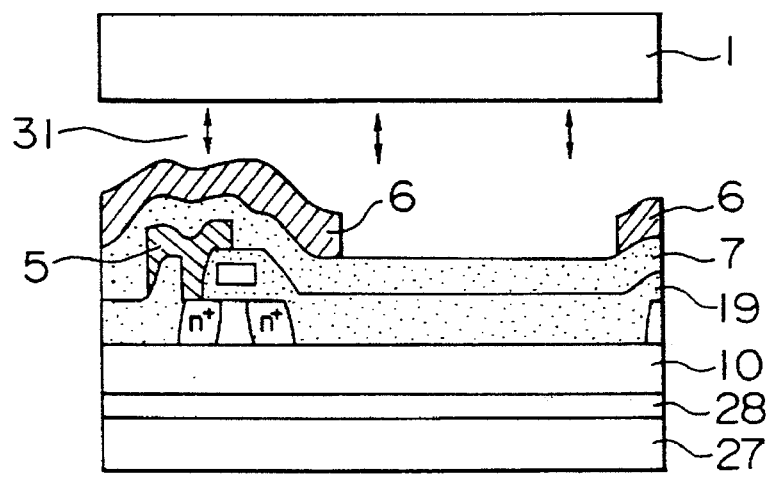

Next, as shown in FIG. 10, the insulating layer 19, the interconnection electrode 5 to be connected to the source portion 2 and the insulating layer 7 are formed by the normal semiconductor device manufacturing process, and then the metal layer 6 is formed to shield the driving transistor portion 18 from light. The metal layer 6 has shoulders having a large magnitude due to the presence of the driving transistor portion 18, the interconnection 5 and so on below the metal layer 6. However, in the structure according to the present invention, since the liquid crystal layer is not provided on the surface of the metal layer 6, there is no problem. The transparent substrate 1 is pasted with surfaces indicated by 31 opposing each other by placing adhesive on the surface of the metal layer 6.

Next, as shown in FIG. 10, the Si substrate 27 is removed using a hydrofluoric acid type etchant. This etching can be carried out without affecting the oxide layer 10 because the SiN film 28 acts as an etch stop layer. Subsequently, the SiN film 28 alone is removed using a phosphoric acid-type etchant having a large selection ratio for SiO$_2$ and SiN.

Figure 11:
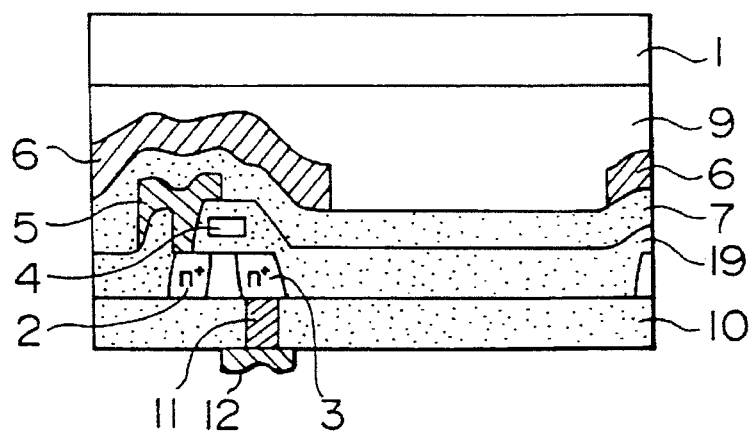

Next, as shown in FIG. 11, the hole (opening) 11 through which contact to the drain portion 3 can be provided is formed, and then the interconnection 12 is extended to the rear surface of the insulating layer 10. Thereafter, the ITO layer serving as the transparent electrode and the insulating layer are formed in sequence, and a liquid crystal is disposed at that area to manufacture an image display device shown in FIG. 2.

As will be understood from the foregoing description, the insulating layer 10 is formed on the surface of the flat Si wafer, and is thus flat. As a result, the electric field applied to the liquid crystal layer 8 can be made uniform.

Figure 12:
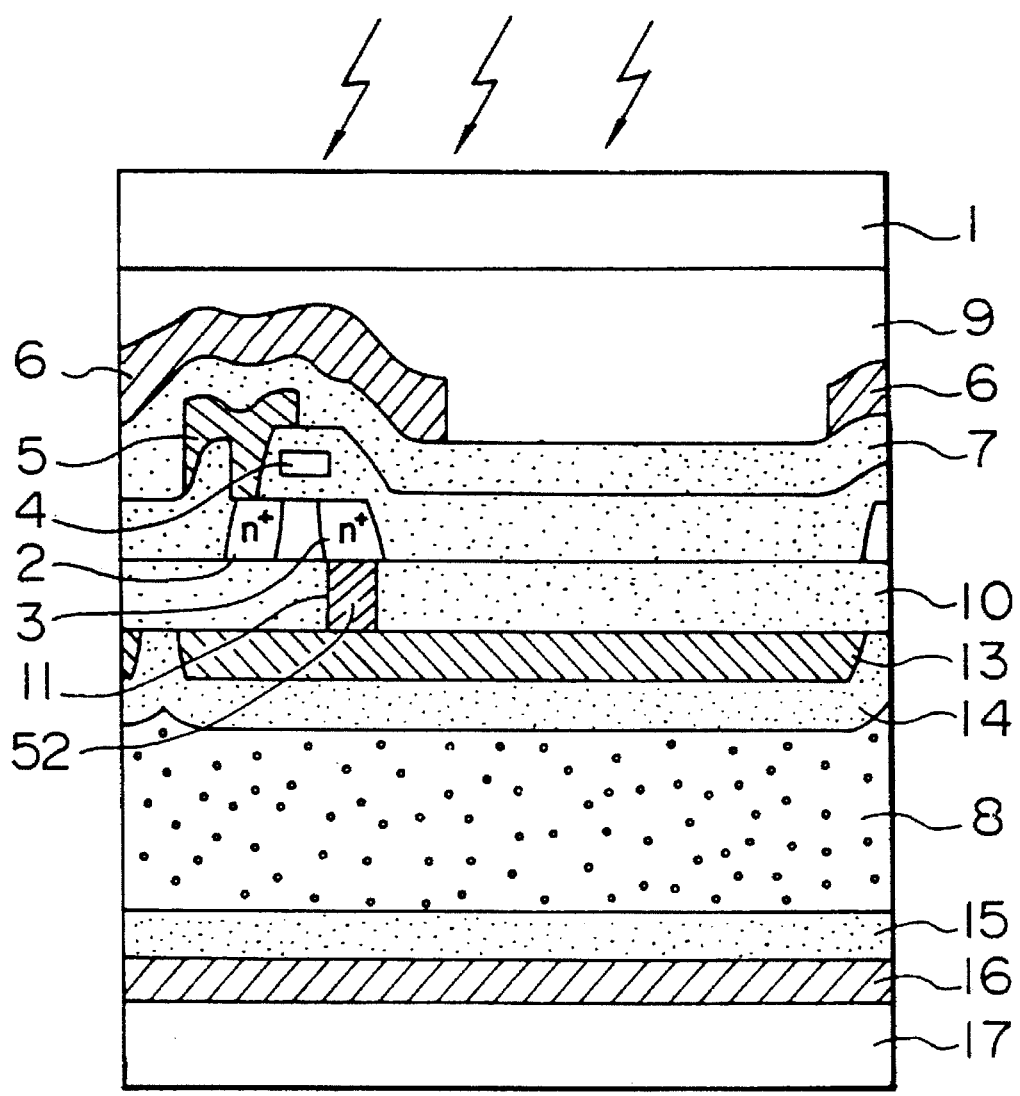
FIGS. 12 through 16, 18 through 22 and 24 through 29 are respectively schematic cross-sectional views of other liquid crystal image display devices according to the present invention.

Another embodiment of the present invention will be described below with reference to FIG. 12. Since reference numerals in FIG. 12 common to those used in FIGS. 2 through 11 represent similar or identical elements, description thereof is omitted. This embodiment is also manufactured by utilizing the SIO technology, as in the aforementioned embodiment.

This embodiment differs from the previous embodiment in that a metal 52 for connecting the drain portion 3 of the driving transistor portion 18 to the transparent electrode 13 on the rear surface of the oxide film 10 is completely embedded in the hole 10, making the surface of the transparent electrode 13 and that of the insulating layer formed on the transparent electrode 13 flatter. Consequently, the electric field applied to the liquid crystal layer 8 can be made more uniform, and the stable operation can be achieved.

The technique for completely embedding the metal may be Al-CVD, which will be described below.

The Al-CVD process is carried out under a pressure of about $10^{-3}$ to 760 Torr and at a substrate temperature of 60° to 450° C. using alkyl aluminum hydride diluted by H$_2$ gas. The details of the Al-CVD process have been disclosed in European Patent Laid-Open No. 425084. According to this process, it is possible to selectively deposit Al on the surface made of an electron donative material. Al-CVD will be described below in detail.

An electron donative material is one in which free electrons are present or intensively produced in a substrate, e.g., a material having a surface which allows chemical reaction to be accelerated by exchange of electrons with the material gas molecules attached to the surface of the substrate. Generally, metals and semiconductors correspond to this electron donative material.

Examples of such an electron donative material include semiconductors, such as single crystal silicon, polycrytal silicon and amorphous silicon, binary, ternary or quadri III–V compound semiconductors obtained by combining a III group element, such as Ga, In or Al with a V group element, such as P, As or N, metals, such as tungsten, molybdenum, tantalum, tungsten silicide, titanium silicide, aluminum, aluminum silicon, titanium aluminum, titanium nitride, copper, aluminum silicon copper, aluminum palladium, titanium, molybdenum silicide and tantalum silicide, alloys and silicides of alloys. Dimethyl aluminum hydride ("DMAH", or (CH$_3$)$_2$AlH) or monomethyl aluminum hydride ("MMAH$_2$", or CH$_3$AlH$_2$) can be used as the alkyl aluminum hydride (DMAH has a dimer structure at ambient temperatures).

In a reaction system in which Al reacts with the material gas and H$_2$, Al is deposited on the substrate made of any of the aforementioned substances by simple heat reaction alone. In a reaction system in which Al reacts with (CH$_3$)$_2$AlH and H$_2$, for example, it is considered that heat reaction be basically as follows:

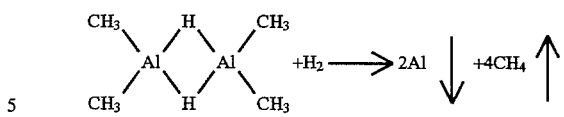

It is impossible to deposit Al on the material other than those described above, for example, a highly insulating material, such as SiO$_2$, Si$_3$N$_4$, SiC, BN, diamond, Al$_2$O$_3$, TaO$_2$, by the vacuum CVD process which employs alkyl aluminum hydride diluted by H$_2$ gas.

Thus, when the insulating layer (SiO$_2$ layer) 10 made of a non-electron donative material is opened to expose the single crystalline (the drain portion 3) surface which is the electron donative surface, as in the case of this embodiment, it is possible to deposit Al on the single crystalline surface alone and to prevent deposition of Al on the insulating layer (SiO$_2$ layer) 10.

Still another embodiment of the present invention will be described below with reference to FIG. 13. Those reference numerals in FIG. 13 used previously in FIGS. 2 through 12 represent similar or identical elements, therefore, description thereof is omitted. This embodiment is also manufactured by utilizing the SOI technology, as in the case of the aforementioned embodiment.

This embodiment differs from the embodiment shown in FIG. 2 in that the under surface of the driving transistor portion 18 is shielded from light by utilizing interconnections 53 and 54 for connecting the drain portion 3 to the transparent electrode 13 provided on the rear surface of the insulating layer 10. Thus, whereas the illumination light enters the device from above as viewed in the figures in the aforementioned two embodiments, the illumination light is incident on the device from below as viewed in FIG. 13 in this embodiment.

This embodiment has advantages in that:

(1) The parasitic capacitance of the interconnection 5 is reduced, making a high-speed transmission of signals possible.

(2) The magnitude of the shoulders of the upper structure (including the driving transistor, the interconnection and so on) of the insulating layer 10 is reduced, facilitating the adhesion of the transparent substrate 1 and improving the positioning accuracy and gate accuracy.

(3) Whereas the light blocking metal layer is provided in the aforementioned two embodiments, provision of such a metal layer is not required in this embodiment. This simplifies the manufacturing process.

Still another embodiment of the present invention will be described below with reference to FIG. 14. Since reference numerals in this figure were used previously in FIGS. 2 through 13 and represent similar or identical elements, description thereof is omitted. This embodiment is also manufactured by utilizing the SOI technology, as in the case of the aforementioned embodiment.

Figure 13:
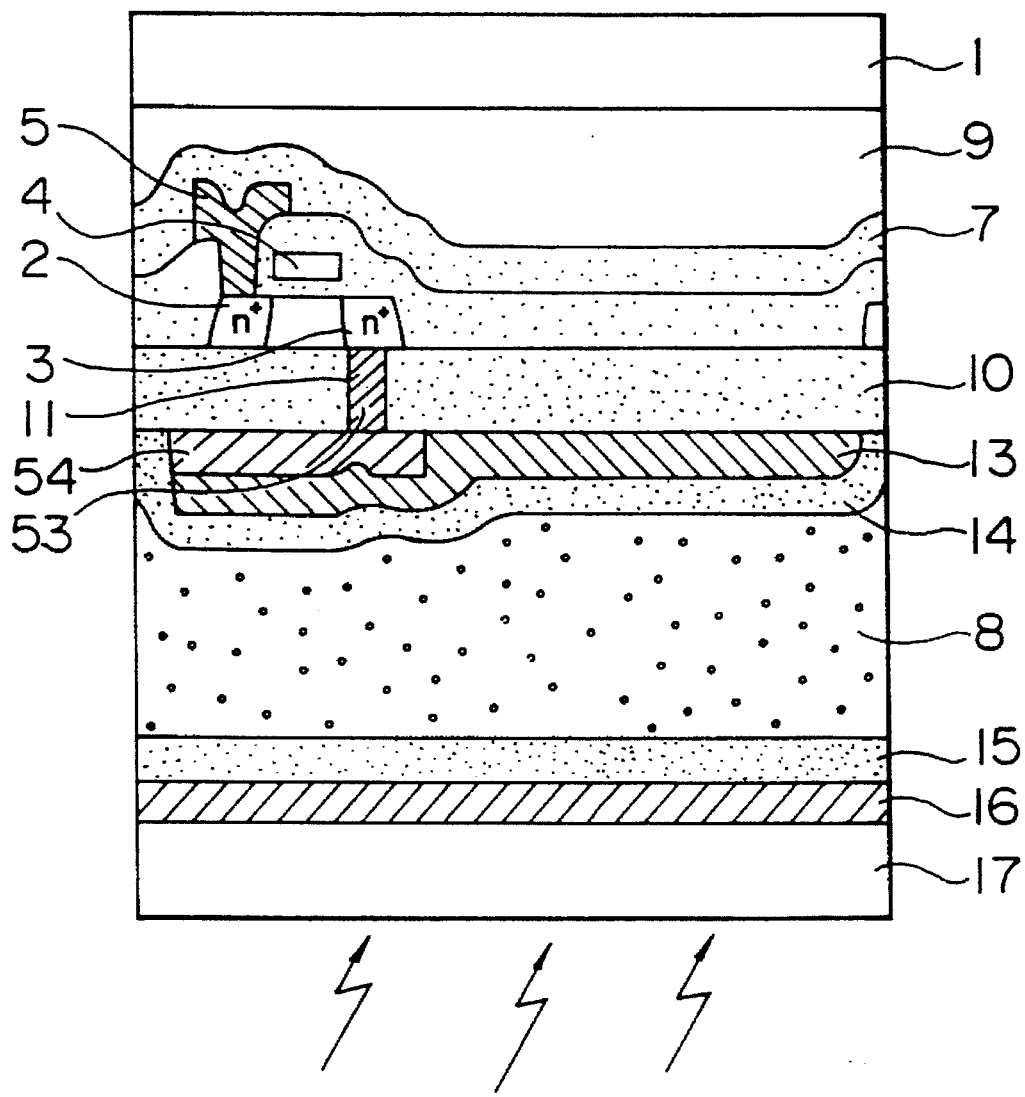
Figure 14:
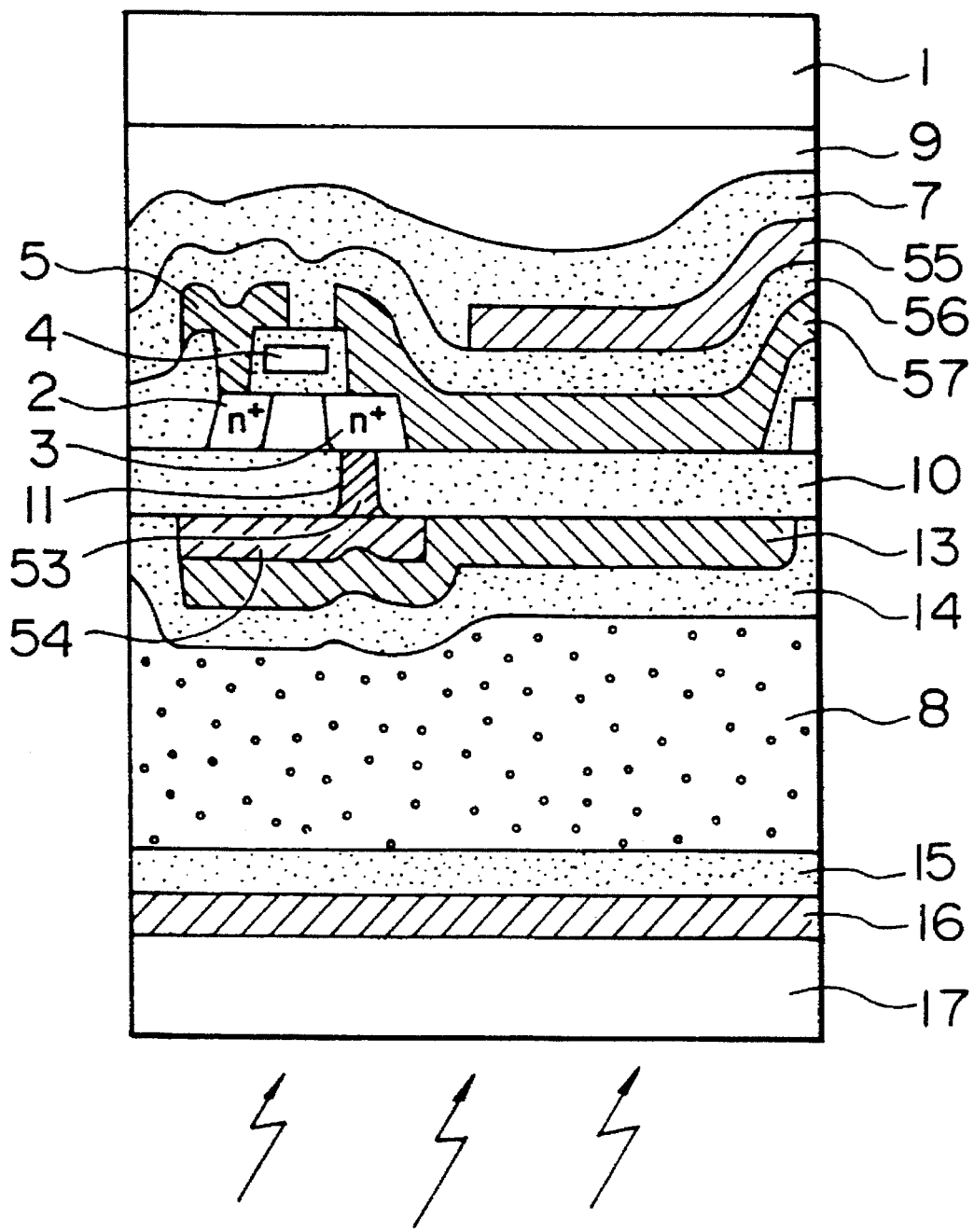

This embodiment differs from the embodiment shown in FIG. 13 in that an additional capacitance is connected to the drain portion 3 by means of transparent electrodes 55 and 57.

The liquid crystal layer 8 is characterized in that the capacitance value thereof varies with time by the application of a voltage. Thus, even when a desired voltage is applied to the liquid crystal layer 8 from the drain portion 3, if the gate portion 4 is off and the liquid crystal portion 8 is thus in a floating state, the voltage applied to the liquid crystal layer 8 varies due to the variable capacitance thereof, adversely affecting the image quality. The voltage also varies through the parasitic capacitance by the signal voltage applied to the adjacent cells. This problem may be solved by providing an additional capacitance sufficiently larger than the capacitance of the liquid crystal layer 3 and the parasitic capacitance by the interconnections on the drain portion 3. In this invention, display of high-quality images is achieved by providing such an additional capacitance on the insulating layer 10. That is, in this embodiment, the additional capacitance is formed by sequentially laminating the transparent electrode 57, an insulating layer 56 and the transparent electrode 55 on the insulating layer 10 in that order. The insulating layer 56 may be a $SiO_2$ or SiN film.

Figure 15:
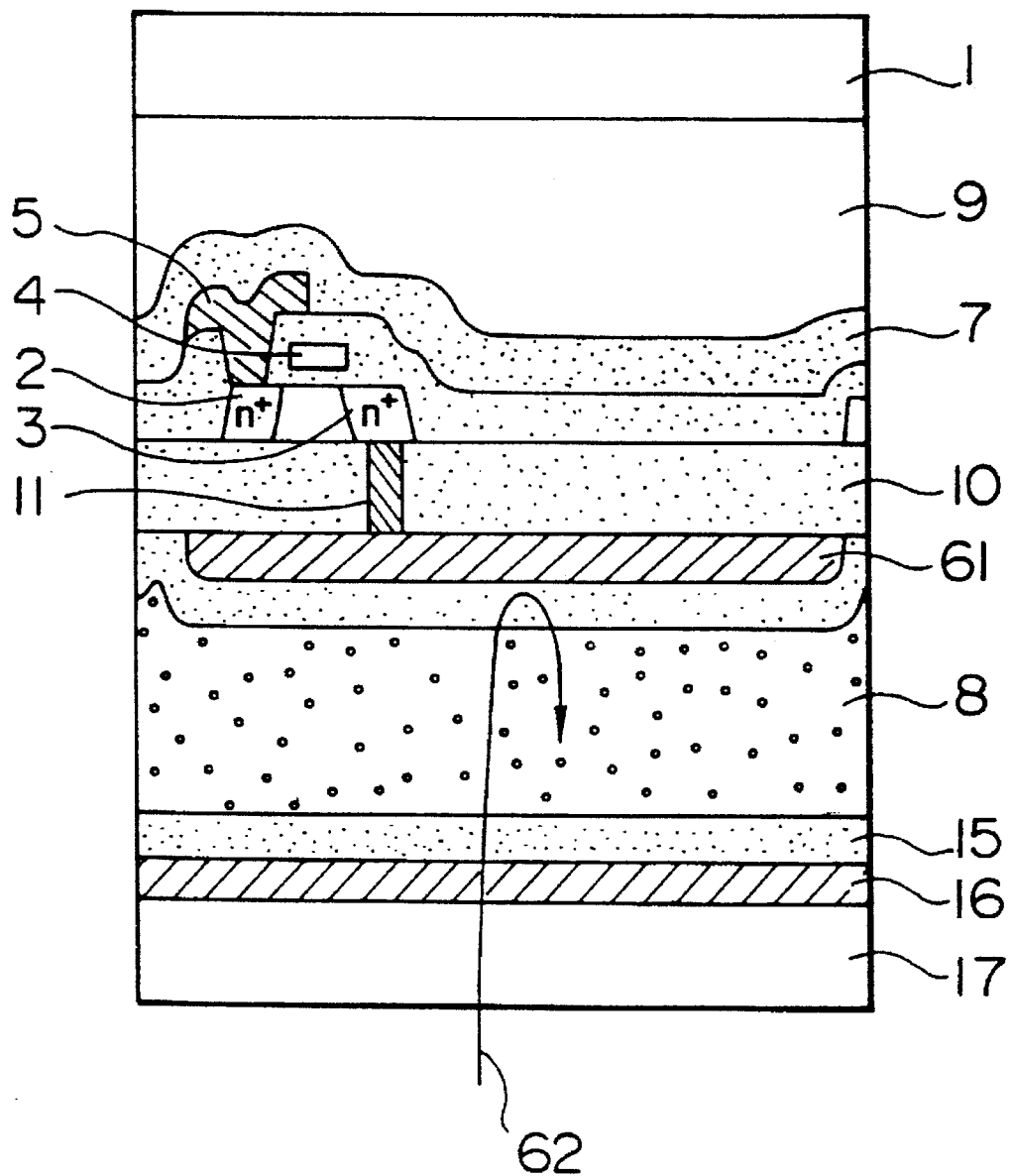

Still another embodiment of the present invention will be described below with reference to FIG. 15. Since reference numerals in FIG. 15 were used previously in FIGS. 2 through 14 and represent similar or identical elements, description thereof is omitted. This embodiment is also manufactured by utilizing the SOI technology, as in the case of the aforementioned embodiment.

This embodiment differs from the other embodiments in that it is a reflection type image display device. In this embodiment, a metal layer 61 having a high reflectance is provided for a single pixel, as shown in FIG. 15, to reflect a light 62 incident on the device from the rear surface. The metal layer 61 serves as the light blocking layer for the thin-film transistor.

In each of the above-described embodiments, the transparent substrate 1 is provided through the adhesive layer 9. However, the transparent substrate 1 may be eliminated and only a resin layer made of, for example, an acrylic resin, polycarbonate, polyethylene or polyvinyl chloride or a resin layer made of a substance other than those may be provided if there is no problem in terms of an optical image display or if a sufficient protection of the image display device from an external force can otherwise be obtained.

The transparent substrate 1 may be made of an inorganic material, such as glass or quartz glass, a resin, such as an acrylic resin, polycarbonate resin or any other plastic, or a combination of the inorganic material and the resin.

Still another embodiment of the present invention will be described below with reference to FIG. 16.

In the aforementioned embodiments, in order to make the image display substrate sufficiently rigid, a transparent insulating substrate may be adhered to the overall surface of the image display substrate with an adhesive layer therebetween. However, since patterning or dicing of the adhesive layer is technically difficult, it is difficult to extend an external connection terminal onto the upper surface of the image display substrate. Also, adhesion of each of the chips to the supporting member may greatly reduce the throughput of the manufacture.

Hence, this embodiment is intended to facilitate the connection of the liquid crystal display device to an external circuit. To achieve this objective, in a liquid crystal display device in which a thin-film transistor is provided on one surface of an insulating film while a display electrode connected to a drain region of the thin-film transistor is provided on the other surface thereof, an electrode for connecting the liquid crystal display device to an external circuit is taken out to the outside of the device on the side of the insulating film on which the display electrode is formed. The embodiment will be described concretely below.

Figure 16:
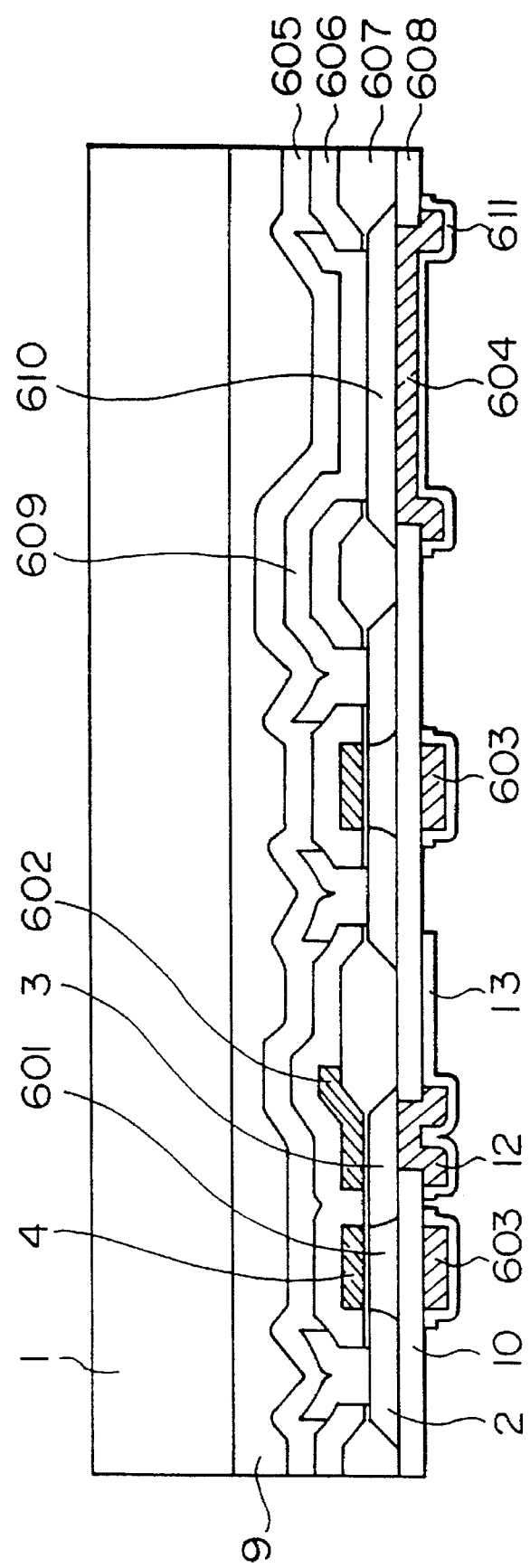

In FIG. 16, reference numeral 1 is a transparent insulating substrate for supporting the device, the transparent insulating substrate being connected to a device substrate with an adhesive layer 9 therebetween; 10 is a transparent insulating layer serving as the device substrate; 4 is a gate electrode of a pixel thin-film transistor which is connected to a horizontal interconnection for driving the liquid crystal display device; 2 is a source electrode of the pixel thin-film transistor which is connected to a vertical interconnection; 601 is a channel region of the pixel thin-film transistor; 3 is a drain region of the pixel thin-film transistor which is connected to a display electrode 13 by means of a rear surface electrode 12 provided on the rear surface of the transparent insulating substrate 10 via a contact hole formed in the portion of the transparent insulating substrate 10 located immediately below the region region 3; 602 is a storage capacitor electrode which forms a storage capacitor together with the drain region 3 of the thin-film transistor through a gate insulating film thereof; 603 is a back gate electrode which also serves to shield the thin-film transistor and is formed concurrently with the formation of the rear surface electrode 12; 604 is a pad region which is extended onto the rear surface for connection to an external circuit and is formed concurrently with the formation of the rear surface electrode 12; 605 through 608 are interlayer insulating films and 609 is an interconnection layer; 610 denotes a semiconductor layer. A circuit for driving the liquid crystal display device containing the thin-film transistor and formed on the transparent insulating substrate 1 and the pad region 604 provided on the rear surface of the transparent insulating substrate 10 are connected to each other through the interconnection layer 609 and the semiconductor layer 610 formed concurrently with the formation of the thin-film transistor, whereby an electrode extension to an external circuit is readily provided. A patterned transparent electrode material 611 for a patterned transparent electrode, such as an ITO substance, is deposited on the pad region 604 when the transparent pixel display electrode is formed. The transparent electrode material 611 is connected electrically to the pad region 604. The external extension to the external circuit is secured through the transparent electrode material 611. It may be achieved by wire bonding or by providing a flexible terminal through a conductive adhesive. To secure a desired transparency of the transparent electrode material 611 at the display pixel region, a transparent electrode material having a thickness of several hundreds to several thousands Å is used. Therefore, the transparent electrode material 611 may break during wire bonding, making incomplete the electrical connection. However, in this embodiment, since the pad region 604 having a sufficient thickness is provided below the transparent electrode material 611, complete electrical connection between the pad region 604 and a wire can be assured.

Figure 17A:
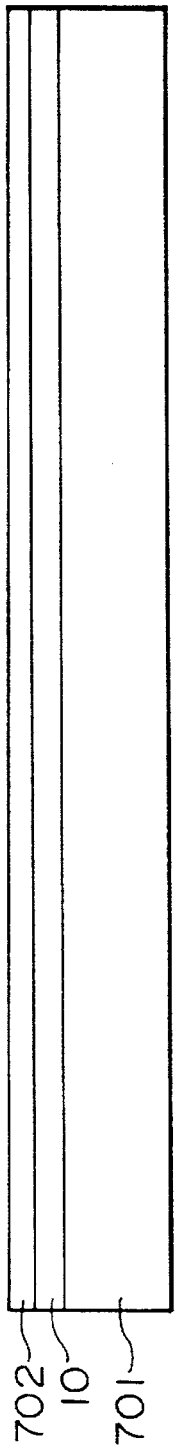

FIGS. 17(a) through 17(d) illustrate the method of manufacturing a device which achieves the structure of this embodiment. First, an SOI substrate in which a semiconductor layer 702 is provided on a semiconductor substrate 701 with the insulating layer 10 therebetween is prepared, as shown in FIG. 17(a). At that time, the technology described in connection with FIGS. 3 through 9 may be used as the SOI substrate manufacturing technology which assures excellent device characteristics. The embodiments which will be described hereinafter are also manufactured by utilizing the aforementioned SOI substrate manufacturing technology.

Figure 17B:
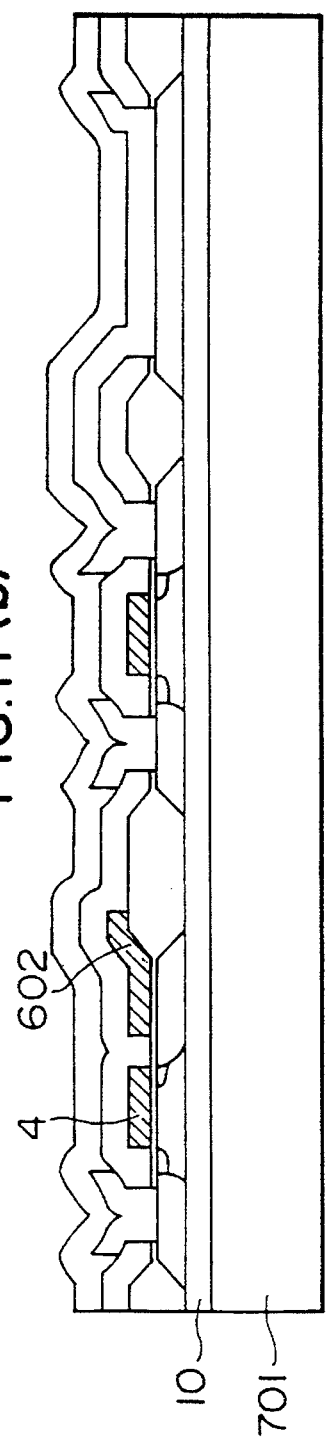
Figure 17C:
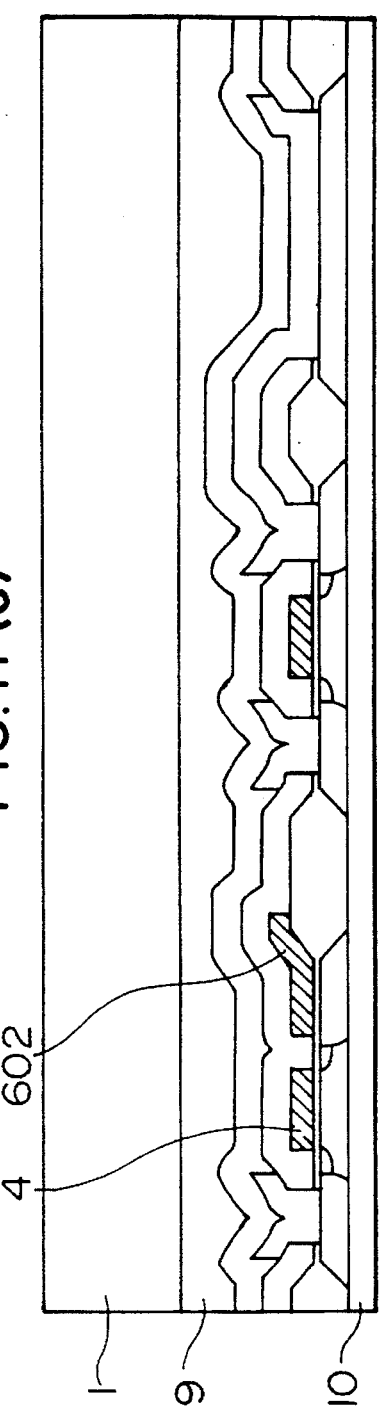
Figure 17D:
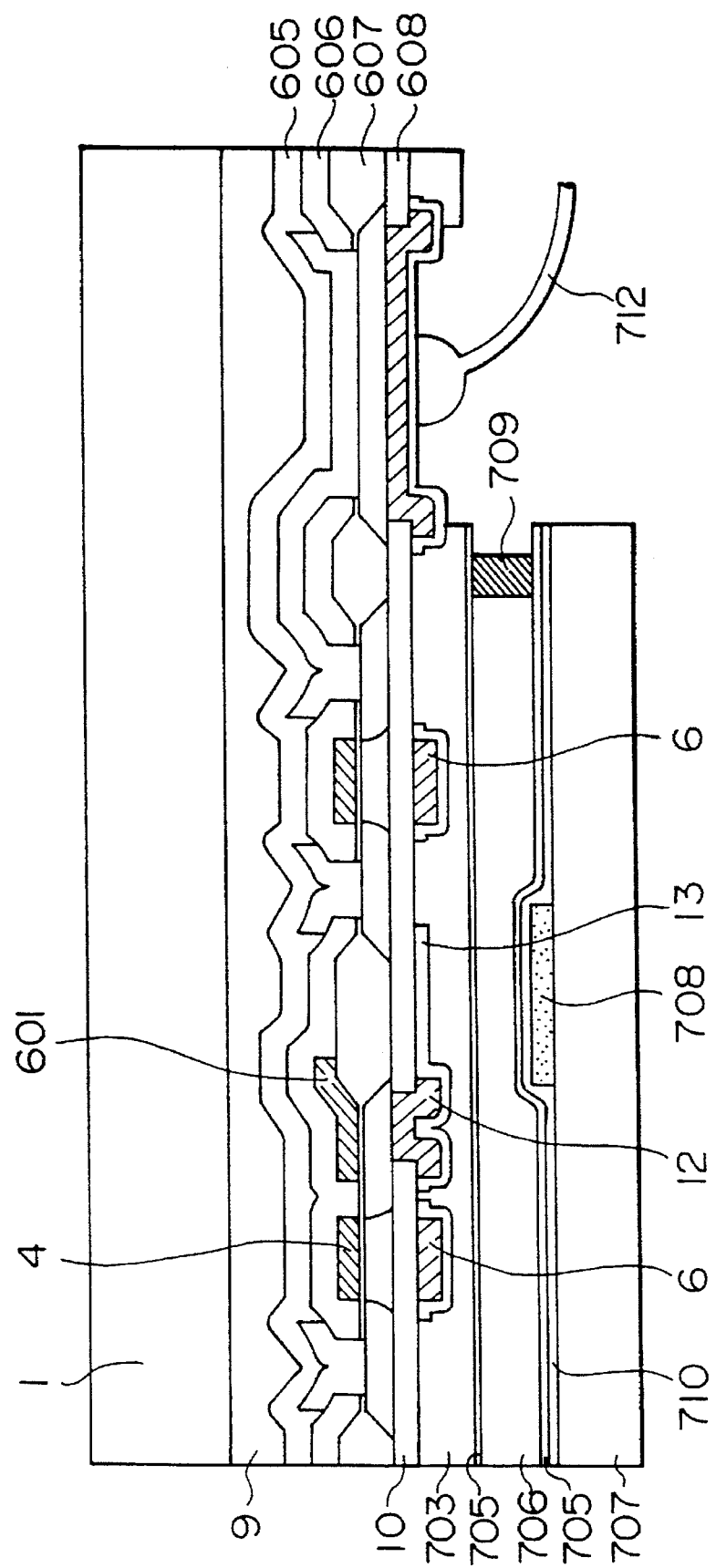

Next, the pixel driving thin-film transistor is provided on the SOI substrate, as shown in FIG. 17(b). Thereafter, as shown in FIG. 17(c), the transparent insulating substrate 1 is adhered to a front surface of the semiconductor substrate 701 through the adhesive layer 9, and then the rear surface of the semiconductor substrate 701 is polished or etched to expose the insulating layer 10. Subsequently, as shown in FIG. 16, the contact hole is opened with respect to the drain region 3 of the pixel thin-film transistor, the rear surface electrode 12 is formed in the contact hole, and then the display electrode 13 is provided on the electrode 12. Also, a contact hole is opened with respect to the semiconductor layer 610 connected to the interconnection layer 609, and the pad region 604 is formed in that contact hole. Next, as shown in FIG. 17(d), an insulating layer 703 and an alignment film 705 are formed, and then a filter substrate, which is a glass substrate 707 with a filter layer 707, an opposing transparent electrode 710 and an alignment film 705 formed thereon, is laminated to the alignment film 705 with a sealing material 706 therebetween. A liquid crystal is charged between the laminated substrates. The thus-obtained liquid crystal display device can be operated when a desired voltage is applied between the electrodes which sandwiches the liquid crystal. In this liquid crystal display device, since the filter substrate is patterned such that it does not overlap the pad region, extension of the electrode to an external circuit from the rear surface of the device can be readily obtained by means of wire bonding or the like.

Figure 18:
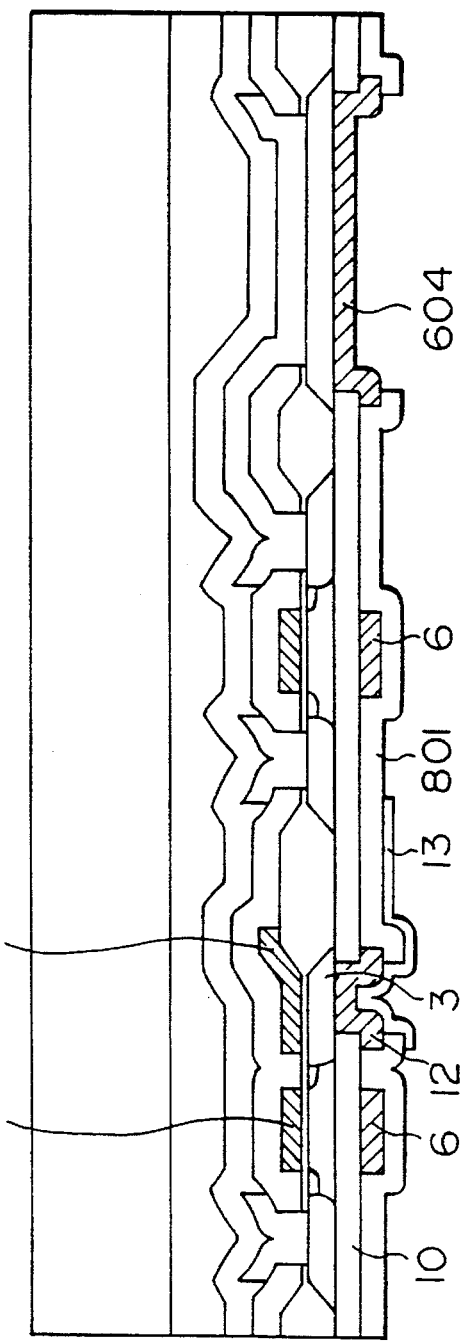

FIG. 18 is a schematic cross-sectional view of still another embodiment of the present invention. In this embodiment, the transparent pixel display electrode 13 is connected to the rear surface electrode 12 through a through-hole provided in an insulating layer 901 which is an interlayer insulator. In this embodiment, extension of an electrode to an external circuit from the pad region 604 can be readily obtained by means of wire bonding or the like, as in the case of the aforementioned embodiment.

Figure 19:
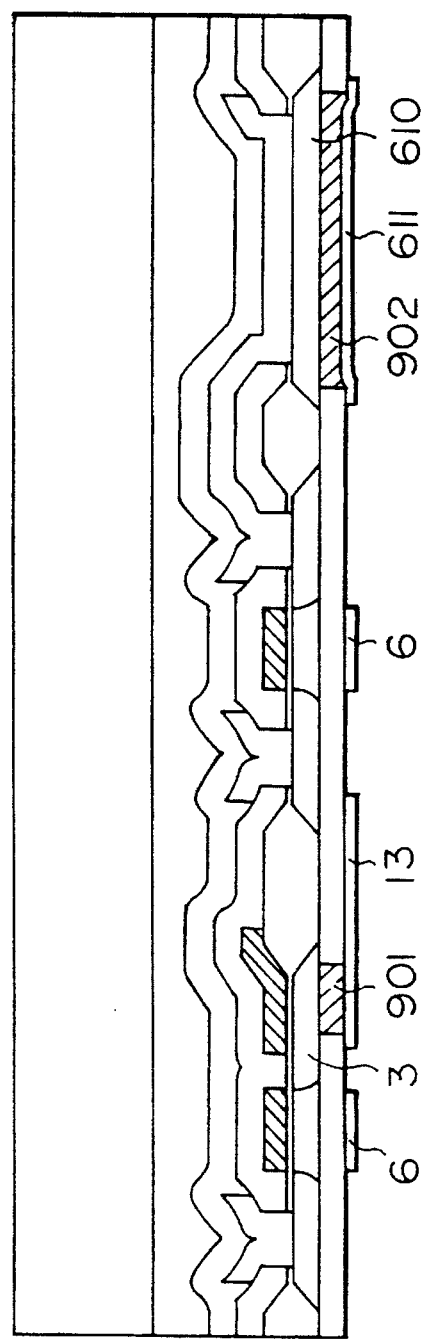

In FIG. 19, reference numeral 13 is a display electrode; 901 is a rear surface electrode which is selectively grown in a contact hole opened with respect to the drain region of the thin-film transistor and through which the display electrode 13 is connected to the drain 3 of the thin-film transistor; and 902 is a pad region which is selectively grown in a contact hole opened to the semiconductor layer 610 concurrently with the formation of the rear surface electrode 901. In this embodiment, a metal which can selectively grow on a semiconductor is used as the taking out electrode, and that metal is grown to a thickness which is substantially the same as the depth of the contact hole so that the display electrode 13 can be formed thereon. Thus, as compared with the aforementioned embodiments, the flatness of the surface of the substrate on which the display electrode is formed is still further improved, making more uniform rubbing possible. Of course, this embodiment has the same advantages as those of the aforementioned embodiments. The aforementioned AL-CVD may be used as the preferable means for selectively growing the electrode in the contact hole.

Figure 20:
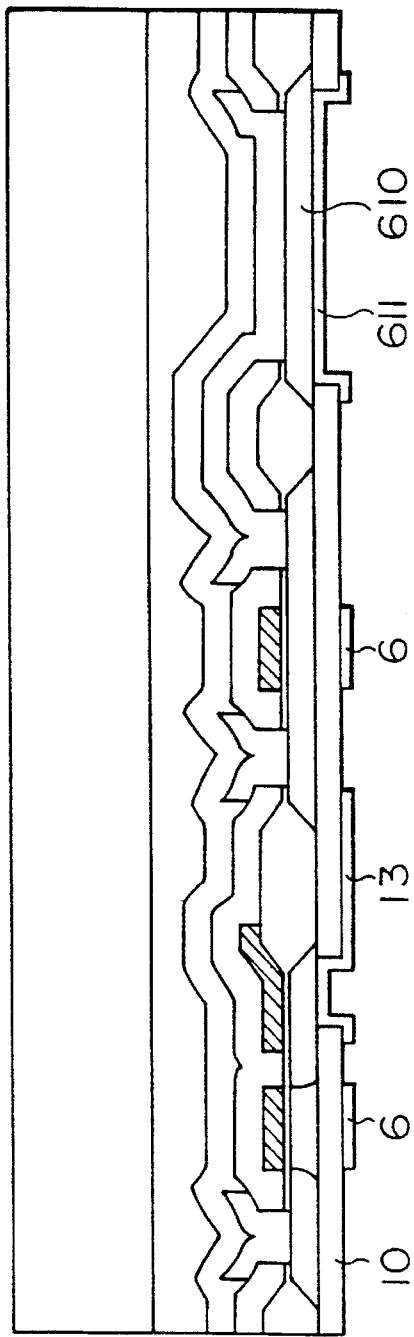

FIG. 20 is a schematic cross-sectional view of still another embodiment of the present invention. In this embodiment, extension of an electrode from the semiconductor layer 610 on the transparent insulating substrate 10 to the rear surface of the device is performed by means of a transparent electrode material via a contact hole opened in the transparent insulating substrate 10. Of course, this embodiment also has the same advantages as those of the aforementioned embodiment shown in FIG. 16.

Figure 21:
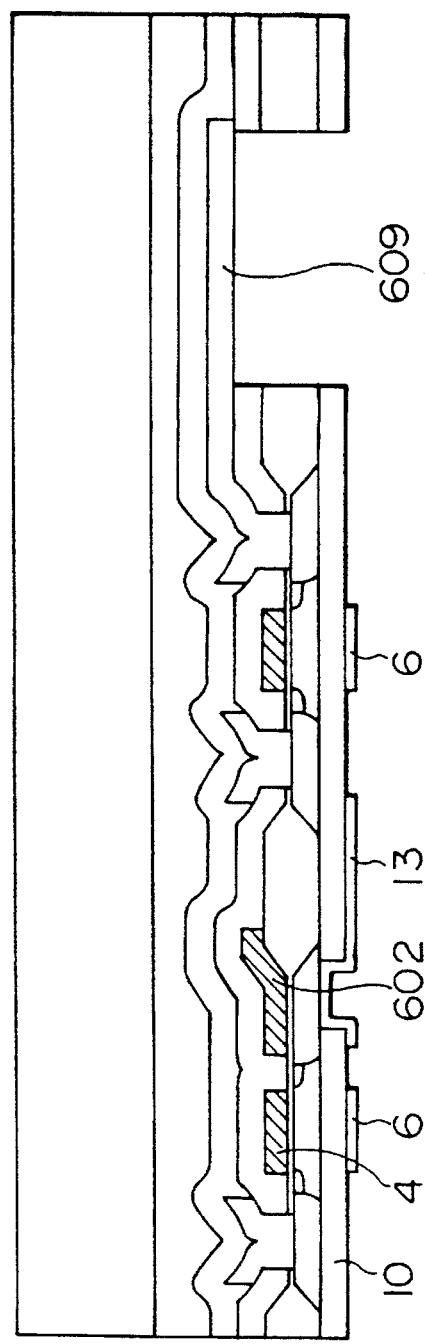

FIG. 21 is a schematic cross-sectional view of still another embodiment of the present invention. In this embodiment, no electrode material is provided on the rear surface of the device, and an externally connected electrode extension port is opened with respect to the interconnection layer 609 by etching. This embodiment has the same advantages as those of the embodiment shown in FIG. 16.

In the embodiments shown in FIGS. 16 through 21, the thin-film transistor is formed on one surface of the insulating film while the display electrode connected to the drain region of the pixel thin-film transistor is provided on the other surface of the insulating film. Also, extension of the electrode for connecting the liquid crystal display device to an external circuit is performed on the side of the insulating film on which the display electrode is formed, whereby the connection to the external circuit is greatly facilitated.

In these image display device according to the present invention, since the surface of the liquid crystal display substrate is flat, alignment can be performed by rubbing independently of the thickness of the interconnection. This makes provision of a high-definition image display device (liquid crystal display device) possible.

Figure 22:
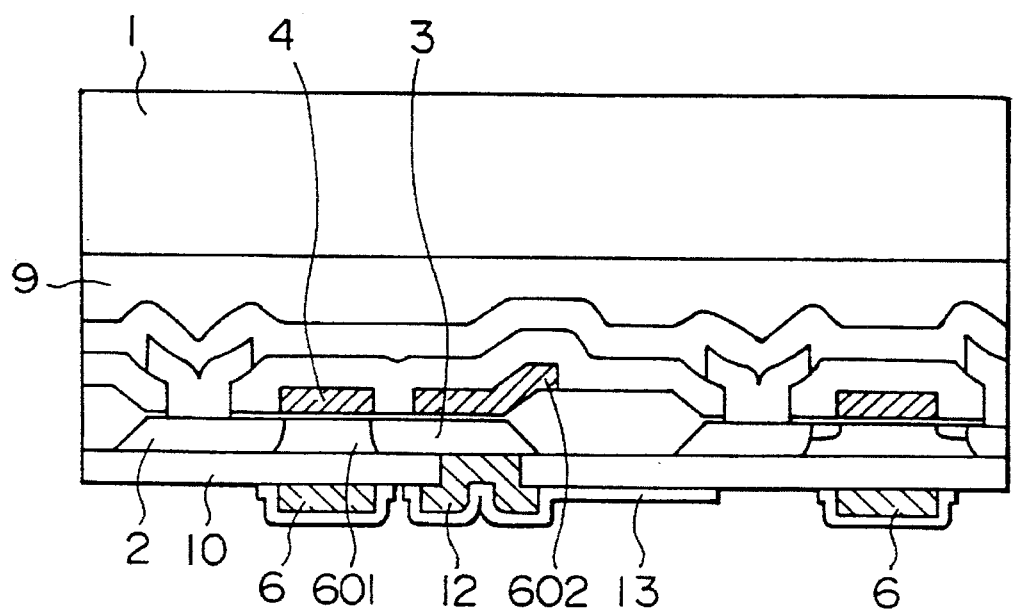

In FIG. 22, reference numeral 1 is a transparent insulating substrate for supporting the device, the substrate being connected to a device substrate with an adhesive layer 9 therebetween; 10 is a transparent insulating layer which serves as the device substrate; 4 is a gate electrode of a pixel thin-film transistor which is connected to a horizontal interconnection for driving the liquid crystal display device; 2 is a source electrode of the pixel thin-film transistor which is connected to a vertical interconnection; 601 is a channel region of the pixel thin-film transistor; 3 is a drain region of the pixel thin-film transistor which is connected to a display electrode 13 through a rear surface electrode 12 provided on the rear surface of the transparent insulating substrate 10 and in a contact hole formed in the transparent insulating substrate 10 below the drain region; 602 is a storage capacitor electrode which forms a storage capacitor together with the drain region 3 through a gate insulating film of the thin-film transistor; and 110 is a light-blocking layer for blocking the thin-film transistor from leaking light. In this embodiment, the light-blocking layer 6 is formed concurrently with the formation of the rear surface electrode 12. Consequently, light blocking can be conducted without including a process of providing a light blocking layer.

Figure 23:
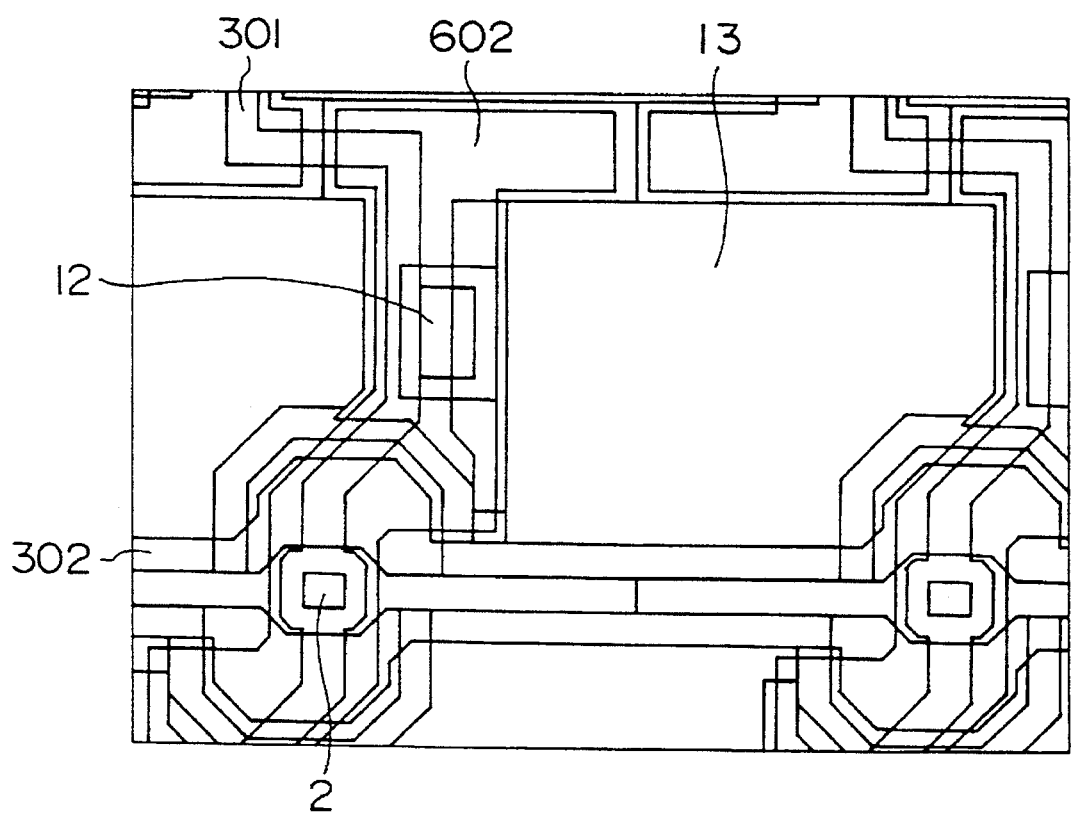
FIG. 23 is a schematic plan view of another embodiment of the liquid crystal image display device according to the present invention.

FIG. 23 is a plan view of this embodiment. Reference numeral 301 is a vertical interconnection which is connected to the source region 2 of the pixel thin-film transistor; and 302 is a horizontal interconnection connected to the gate electrode 4 of the pixel thin-film transistor.

As mentioned above, the conventional structure suffers from the problems in that the image quality deteriorates due to the deflection of the voltage of the display electrode and in that display failure occurs due to non-uniform rubbing. However, in the present invention, since the interconnection layer and the display electrode are formed on the different planes, as shown in FIG. 22, the capacitive coupling is restricted, thus restricting the deflection of the voltage of the display electrode and improving the image quality. Furthermore, since the surface of the substrate on which the display electrode is formed is substantially flat, as shown in FIG. 22, it is possible to perform rubbing irrespective of the thickness of the interconnection.

In this embodiment, since the storage capacitive electrode 602 disposed between the interconnection layer 301 and the display electrode 13 in the manner shown in FIG. 23 shields the interconnection layer 301 and the display electrode 13, the deflection of the voltage can further be restricted. Furthermore, the storage capacitive electrode 603 can be effectively provided immediately above the connection hole opened to the display electrode 13, unlike the conventional structure. Therefore, the aperture ratio can be increased. Additionally, a back gate electrode provided immediately below the channel region of the thin-film transistor using the rear surface electrode material serves to fix the potential immediately below the channel, the leaking current of the thin-film transistor can be reduced. Finally, the light-blocking layer for the thin-film transistor can be formed using the rear surface electrode material concurrently with the formation of the rear surface electrode material.

The procedures of manufacturing the thin-film transistor are the same as those shown in FIG. 2 in which it is possible to form the light-blocking layer without increasing unnecessary shoulders or process cost. Furthermore, in this embodiment, a back gate voltage can be applied to the portion immediately below the channel of the thin-film transistor by applying a desired voltage to the light-blocking layer 110. Consequently, the potential of the portion immediately below the channel region can be fixed, and the leaking current of the thin-film transistor can thus be reduced.

Figure 24:
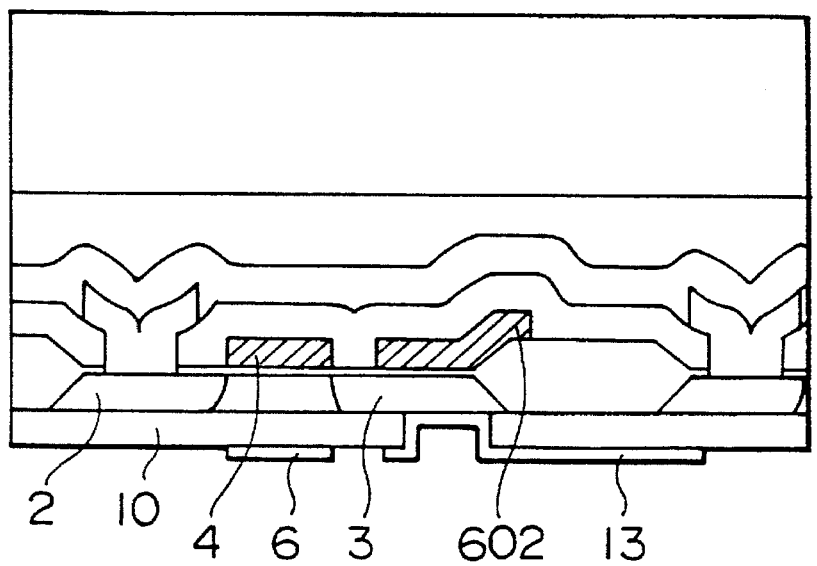

FIG. 24 is a schematic cross-sectional view of still another embodiment of the present invention. In the figure, reference numeral 13 denotes a display electrode which is directly connected to the drain region 3 of the thin-film transistor via the contact hole opened to the drain region 3.

In addition to the advantages obtained by the aforementioned embodiment, in this embodiment, the process cost can be reduced because of the elimination of the process of forming the electrode for connection and in that rubbing can be performed more uniformly because the flatness of the surface of the substrate on which the display electrode is formed is improved.

Figure 25:
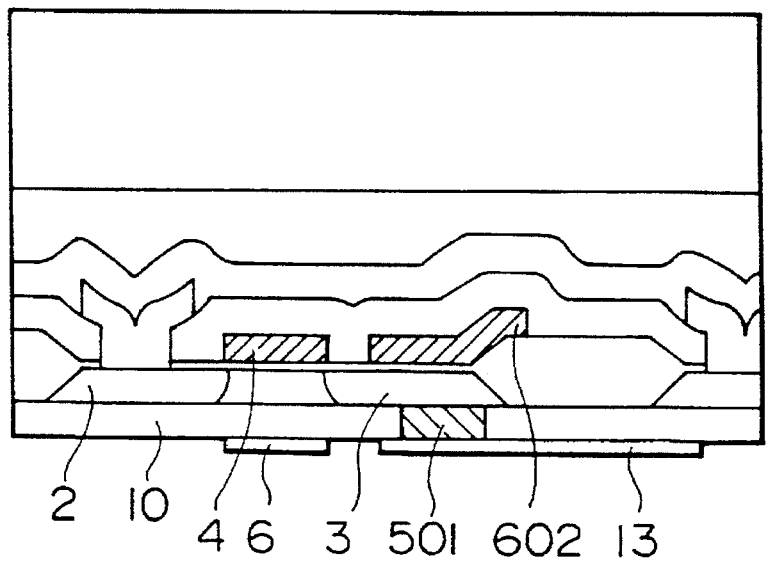

FIG. 25 is a schematic cross-sectional view of still another embodiment of the present invention. In the figure, reference numeral 13 denotes a display electrode; and 501 denotes a rear surface electrode which is selectively grown in the contact hole opened to the drain region 3 of the thin-film transistor so as to connect the display electrode 13 to the drain region 3 of the thin-film transistor.

In this embodiment, the metal capable of selectively grow on a semiconductor is used. This metal is grown as the taking out electrode to a thickness substantially the same as the depth of the contact hole, and the display electrode 13 is formed on this taking out electrode. As a result, the flatness of the surface of the substrate on which the display electrode is formed is further improved, when compared with the previous embodiment, and more uniform rubbing can thus be performed. This embodiment has the same advantages as those of the previous embodiment. The electrode may be selectively grown in the contact hole using the aforementioned AL-CVD technology.

Figure 26:
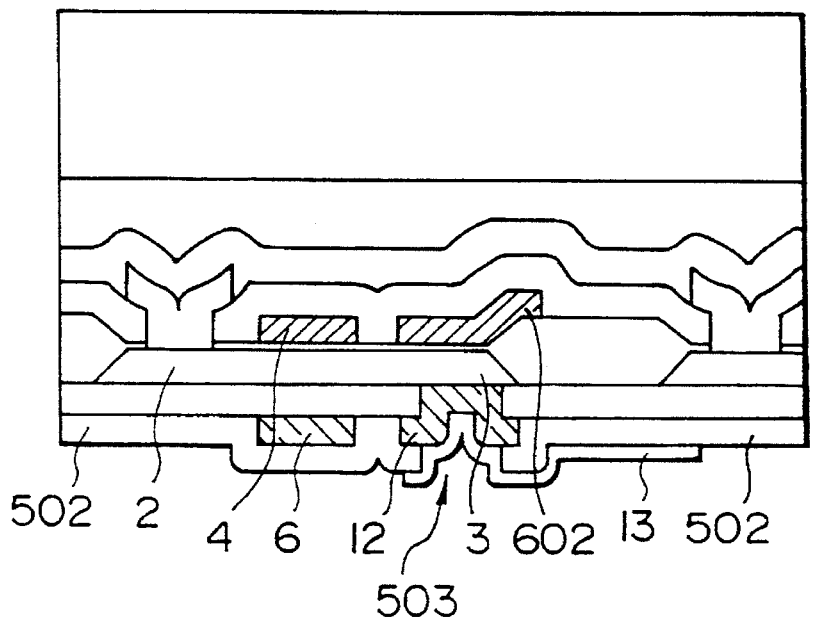

FIG. 26 is a schematic cross-sectional view of still another embodiment of the present invention. In this embodiment, an interlayer film 502 is formed on the rear surface electrode 12, and the display electrode 13 is formed in a contact hole 503 formed in the interlayer film 502. This embodiment as the same advantages as those of the aforementioned embodiment.

FIG. 27 is a schematic cross-sectional view of still another embodiment of the present invention. As shown in FIG. 27, a contact hole is provided immediately below the channel region 601 of the thin-film transistor so as to electrically connect the light-blocking layer 6 to the channel region 601 and thereby enable a desired voltage to be applied to the light-blocking layer 6.

In addition to the same advantages as those of the embodiment shown in FIG. 22, in this embodiment, the resistance of the sub contact can be reduced because the sub contact is taken out from immediately below the channel region 601, thus improving the voltage the thin-film transistor can withstand.

Figure 28:
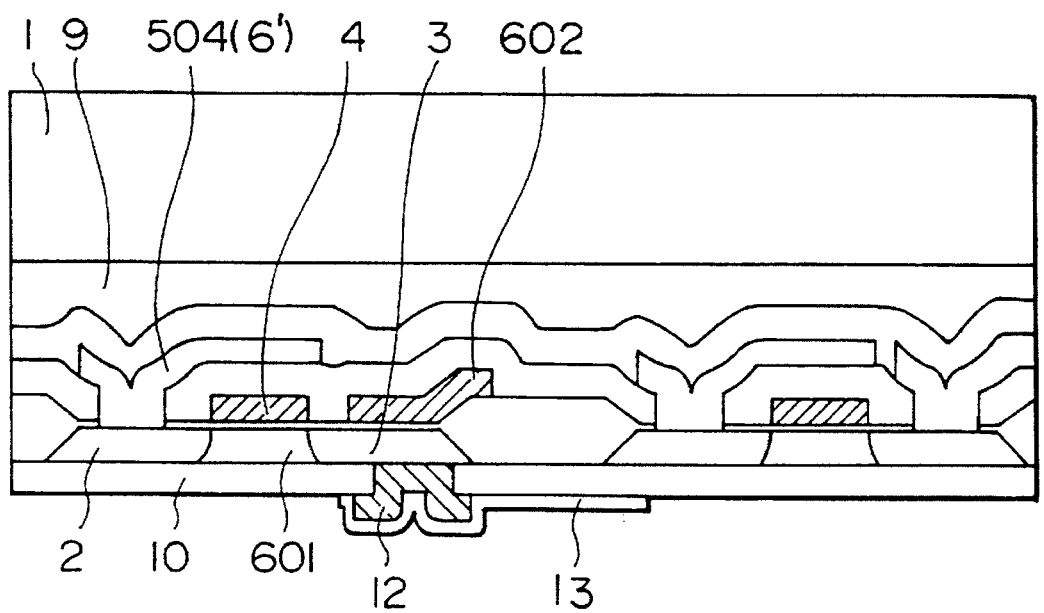

FIG. 28 is a schematic cross-sectional view of still another embodiment of the present invention. In the figure, reference numeral 504 denotes a vertical interconnection connected to the source 2 of the thin-film transistor. The vertical interconnection is patterned such that it covers the channel region 601 of the thin-film transistor. The structure of this embodiment has the same advantages as those of the embodiment described in connection with FIG. 22.

Figure 29:
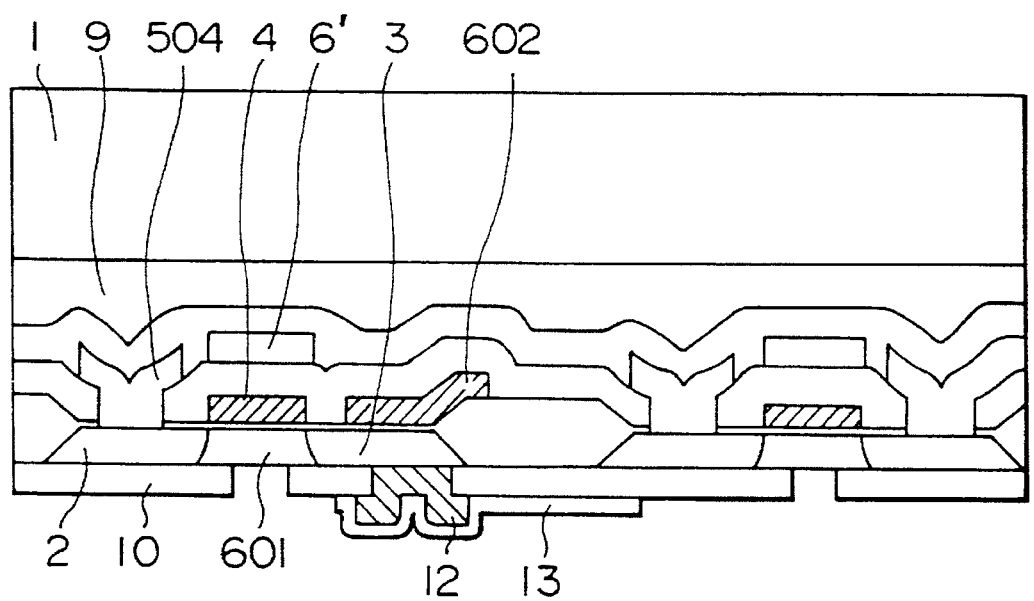

In this embodiment, the vertical interconnection 504 is also used as the light-blocking layer. Alternatively, patterning may be performed such that the vertical interconnection 504 and a light-blocking layer 6' are provided separately, as shown in FIG. 29. This structure ensures the same advantage as that of the aforementioned embodiment.

As will be understood from the foregoing description, in the image display device according to the present invention, the transistor and the interconnection layer therefor are formed on one surface of the insulating layer, while the liquid crystal voltage applying electrode for applying a voltage to the liquid crystal is formed on the other surface of the insulating layer, and one of the major electrode portions of the transistor and the liquid crystal voltage applying electrode are connected to each other by an electrode via the opening in the insulating layer. Consequently, the liquid crystal voltage applying electrode can be provided on the flat surface of the insulating layer, making the electric field applied to the liquid crystal layer uniform. This allows the stable operation to be maintained. Even if the pixel size is reduced, the magnitude of the shoulders does not increase. This makes the structure of this invention suitable for use as a fine cell structure. Furthermore, since the light-blocking layer can be provided close to the upper surface of the transistor, cross-talk caused by light leakage from among the adjacent pixels can be improved, increasing the aperture ratio and S/N ratio.

In the aforementioned image display device, when the electrode for connecting the major electrode portion of the transistor to the liquid crystal voltage applying electrode is embedded in the opening in the insulating layer, the connecting electrode does not generate irregularities on the surface of the insulating layer. This makes the electric field applied to the liquid crystal layer more uniform, making stable operation possible.

In the aforementioned image display device, when the electrode for connecting the major electrode portion of the transistor to the liquid crystal voltage applying electrode is formed on the other surface of the insulating layer so that it shields the transistor, the parasitic capacitance of the interconnection is reduced, and a high-speed transmission of signals is thus achieved. Also, since it is not necessary for another light-blocking layer to be formed, the manufacturing process is simplified, and the magnitude of the shoulders of the upper structure (including the driving transistor, the interconnections and so on) of the insulating layer is reduced. This makes adhesion of the transparent substrate easy and increases the positioning accuracy and gate accuracy.

In the aforementioned image display device, when the first transparent electrode is connected to the major electrode of the transistor while the second transparent electrode is formed on the first transparent electrode with the insulating layer therebetween, a capacitance larger than that of the liquid crystal layer or that of the interconnections can be added to restrict variations in the voltage due to the variable capacitance characteristics and parasitic capacitance of the liquid crystal.

Furthermore, the pixel driving thin-film transistor and the driving interconnection therefor are provided on one surface of the insulating film while the display electrode connected to the drain region of the pixel thin-film transistor is provided on the other surface thereof. Consequently, the deflection of the voltage of the display electrode due to cross-talk can be reduced, and the display quality of the liquid crystal display device can thus be improved.

Furthermore, when the light-blocking layer is provided using the same material as that of the electrode for the thin-film transistor, an increase in the magnitude of the shoulders and in the process cost can be restricted. This makes the provision of a low cost image display device (liquid crystal display device) assuring high display quality possible.

The invention described above in the context of the preferred embodiments shown in the accompanying drawings is not to be so limited but is rather be constructed broadly within the spirit and scope set out in the appended claims.

What is claimed is:

1. A method of manufacturing an image display device, comprising the steps of:

preparing a first substrate comprising a first substrate base and a second substrate base, said first substrate base prepared by forming a porous layer by anodizing single crystal silicon, forming an epitaxial layer of single crystal silicon on said porous layer, and forming a silicon oxide film on said epitaxial layer;

preparing said second substrate base by forming on single crystal silicon a nitrogen-containing silicon film and then by forming a silicon oxide film on said nitrogen-containing silicon film;

opposing said silicon oxide films of said first and second substrate bases and then heat coupling said first and second substrate bases to each other;

removing at least said porous layer of said first substrate base;

removing a portion of said epitaxial layer of said first base;

forming a transistor in a remaining portion of said epitaxial layer;

removing the single crystal silicon on said second substrate base;

forming an opening in said silicon film containing nitrogen and said silicon oxide films of said second substrate base;

providing an interconnection electrically connecting said transistor in at least said opening;

forming on said nitrogen-containing silicon film an electrode layer electrically connected to said interconnection;

forming an insulating layer on said electrode layer;

preparing a second substrate having an electrode;

orienting said first and second substrates such that the electrode on said second substrate is opposed to said electrode layer; and providing a liquid crystal layer between said first and second substrates.

2. The method of manufacturing an image display device according to claim 1, wherein said interconnection in said opening is formed by a CVD process.

3. The method of manufacturing an image display device according to claim 2, wherein said CVD process uses alkyl aluminum halide.

4. The method of manufacturing an image display device according to claim 1, wherein said heat coupling is performed at a temperature of 600° C. or above.

5. The method of manufacturing an image display device according to claim 1, wherein said heat coupling is performed in an oxygen, nitrogen, hydrogen or diluted gas atmosphere.

6. The method of manufacturing an image display device according to claim 5, wherein said heat coupling is performed at a temperature of 600° C. or above.

7. The method of manufacturing an image display device according to claim 1, wherein said first and second bases are washed using pure water and at least one of: a mixture of sulfuric acid and hydrogen peroxide, a mixture of hydrochloric acid and hydrogen peroxide, hydrofluoric acid, a mixture of hydrofluoric acid and hydrogen peroxide, or an aqueous ammonia solution prior to said opposing and heat coupling said silicon oxide films.

8. The method of manufacturing an image display device according to claim 1, where said single crystal silicon on said second base is removed using a solution containing hydrofluoric acid.

9. The method of manufacturing an image display device according to claim 1, wherein said porous layer is formed using at least one of hydrofluoric acid or buffered hydrofluoric acid.

10. The method of manufacturing an image display device according to claim 9, wherein said porous layer is formed using a composition comprising said at least one of hydrofluoric acid or buffered hydrofluoric acid and at least one of alcohol and hydrogen peroxide.

11. The method of manufacturing an image display device according to claim 1, wherein said electrode layer is transparent.

12. The method of manufacturing an image display device according to claim 1, wherein said electrode layer has high reflectance.

* * * * *

UNITED STATES PATENT AND TRADEMARK OFFICE
CERTIFICATE OF CORRECTION

PATENT NO. : 5,633,182

DATED : May 27, 1997

INVENTOR(S) : MAMORU MIYAWAKI, ET AL.   Page 1 of 2

It is certified that error appears in the above-identified patent and that said Letters Patent is hereby corrected as shown below:

On the tittle page, item

[56] REFERENCES CITED

FOREIGN PATENT DOCUMENTS

"2154232" should read --2-154232--; and
"04056282 should read --4-56282--.

OTHER PUBLICATIONS

"Holstom et al." should read --Holmstom et al.--; and
"Oxidited" should read --Oxidized--.

[57] ABSTRACT

Line 13, "shield" should read --shields--.

COLUMN 2

Line 61, "resulting" should read --resulting in--.

COLUMN 6

Line 7, "that" should read --That--;
Line 16, "Uhlir et al" should read --Uhlir et al.--; and
Line 18, "et al" should read --et al.--.

COLUMN 7

Line 45, "sin" should read --SiN--.

UNITED STATES PATENT AND TRADEMARK OFFICE
CERTIFICATE OF CORRECTION

PATENT NO. : 5,633,182

DATED : May 27, 1997

INVENTOR(S) : MAMORU MIYAWAKI, ET AL.

It is certified that error appears in the above-identified patent and that said Letters Patent is hereby corrected as shown below:

COLUMN 9

Line 25, "hole 10," should read --hole 11,--; and
    Line 48, "polycrytal" should read --polycrystal--.

COLUMN 10

Line 7, "impossible" should read --also impossible--.

COLUMN 14

Line 10, "device" should read --devices--; and
    Line 33, "110" should read --6--.

COLUMN 15

Line 13, "layer 110." should read --layer 6.--;
    Line 36, "grow" should read --growing--; and
    Line 52, "as" should read --has--.

Signed and Sealed this

Sixteenth Day of December, 1997

Attest:

BRUCE LEHMAN

*Attesting Officer*    *Commissioner of Patents and Trademarks*